US012034010B2

(12) United States Patent
Suzuki et al.

(10) Patent No.: US 12,034,010 B2
(45) Date of Patent: Jul. 9, 2024

(54) ACTIVE MATRIX SUBSTRATE

(71) Applicant: Sharp Kabushiki Kaisha, Sakai (JP)

(72) Inventors: Masahiko Suzuki, Sakai (JP); Tetsuo Kikuchi, Sakai (JP); Hideki Kitagawa, Sakai (JP); Setsuji Nishimiya, Sakai (JP); Kengo Hara, Sakai (JP); Hitoshi Takahata, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/119,624

(22) Filed: Mar. 9, 2023

(65) Prior Publication Data

US 2023/0215876 A1 Jul. 6, 2023

Related U.S. Application Data

(63) Continuation of application No. 17/156,769, filed on Jan. 25, 2021, now Pat. No. 11,637,132.

(Continued)

(51) Int. Cl.
*H01L 27/12* (2006.01)
*H01L 29/786* (2006.01)
*H01L 29/00* (2006.01)

(52) U.S. Cl.
CPC ........ *H01L 27/124* (2013.01); *H01L 27/1222* (2013.01); *H01L 27/1225* (2013.01);
(Continued)

(58) Field of Classification Search
CPC ... H01L 27/124; H01L 27/12; H01L 27/1222; H01L 27/1225; H01L 27/1237;
(Continued)

(56) References Cited

U.S. PATENT DOCUMENTS

| 11,063,068 | B2 * | 7/2021 | Jeon | H01L 27/1255 |
| 2017/0090229 | A1 * | 3/2017 | Imai | H01L 29/78633 |
| 2020/0144309 | A1 * | 5/2020 | Jeon | H01L 27/1218 |

OTHER PUBLICATIONS

Suzuki et al., "Active Matrix Substrate and Method for Manufacturing Same", U.S. Appl. No. 17/156,769, filed Jan. 25, 2021.

\* cited by examiner

*Primary Examiner* — Nikolay K Yushin
(74) *Attorney, Agent, or Firm* — Keating & Bennett, LLP

(57) ABSTRACT

An active matrix substrate includes a plurality of gate bus lines, a plurality of source bus lines located closer to the substrate side; a lower insulating layer that covers the source bus lines; an interlayer insulating layer that covers the gate bus lines; a plurality of oxide semiconductor TFTs disposed in association with respective pixel regions; a pixel electrode disposed in each of the pixel regions; and a plurality of source contact portions each of which electrically connects one of the oxide semiconductor TFTs to the corresponding one of the source bus lines, in which each of the oxide semiconductor TFTs includes an oxide semiconductor layer disposed on the lower insulating layer, a gate electrode disposed on a portion of the oxide semiconductor layer, and a source electrode formed of a conductive film, and each of the source contact portions includes a source contact hole, and a connection electrode.

12 Claims, 26 Drawing Sheets

Related U.S. Application Data

(60) Provisional application No. 62/971,249, filed on Feb. 7, 2020.

(52) U.S. Cl.
CPC ........ H01L 27/1237 (2013.01); H01L 27/127 (2013.01); H01L 29/7869 (2013.01); H01L 29/78696 (2013.01)

(58) Field of Classification Search
CPC ............... H01L 27/127; H01L 27/1259; H01L 29/7869; H01L 29/786; H01L 29/78696; H01L 29/41733; H01L 29/417; H01L 29/78612; H01L 29/78621; H01L 29/78633
See application file for complete search history.

ACTIVE MATRIX SUBSTRATE

BACKGROUND

1. Field

The present disclosure relates to an active matrix substrate and a method for manufacturing the same.

2. Description of the Related Art

A display device including an active matrix substrate provided with a switching element for each pixel is widely used. An active matrix substrate including a thin film transistor (hereinafter, referred to as "TFT") as a switching element is referred to as a TFT substrate. In the present specification, a portion of the TFT substrate corresponding to a pixel of the display device is referred to as a pixel region or a pixel. A TFT provided as the switching element in each pixel of the TFT substrate is referred to as a "pixel TFT". A plurality of source bus lines and a plurality of gate bus lines are provided on the TFT substrate, and pixel TFTs are disposed near intersection portions of these. A source electrode of the pixel TFT is connected to one of the source bus lines, and a gate electrode is connected to one of the gate bus lines.

In recent years, it has been proposed to use an oxide semiconductor instead of amorphous silicon or polycrystalline silicon as a material for an active layer of the TFT. Such a TFT is referred to as an "oxide semiconductor TFT". The oxide semiconductor has higher mobility than amorphous silicon. Therefore, the oxide semiconductor TFT can operate at higher speed than an amorphous silicon TFT. Since an oxide semiconductor film is formed by a simpler process than a polycrystalline silicon film, the oxide semiconductor film can be applied to an apparatus which uses a large area.

Most oxide semiconductor TFTs are bottom gate type TFTs, and a top gate type oxide semiconductor TFT has also been proposed (for example, Japanese Unexamined Patent Application Publication No. 2015-109315 and International Publication No. 2015/186619).

Japanese Unexamined Patent Application Publication No. 2015-109315 discloses a top gate type TFT in which a gate electrode is provided on a portion of an oxide semiconductor layer with a gate insulating layer in between, and source and drain electrodes are provided on an insulating layer which covers the gate electrode.

On the other hand, International Publication No. 2015/186619 by the present applicant proposes a substrate structure (hereinafter, "lower source structure") in which a source electrode and a source bus line are provided closer to a substrate side than a gate bus line. In this structure, the source bus line is disposed closer to the substrate side than the oxide semiconductor layer of the oxide semiconductor TFT, and the gate bus line is disposed above the oxide semiconductor layer. According to the TFT substrate having the lower source structure (hereinafter, referred to as "lower source structure substrate"), since an insulating layer located between the source bus line and the gate bus line can be thickened, it is possible to reduce the parasitic capacitance generated at an intersection portion of these bus lines.

In the lower source structure substrate, for example, the active layer of the pixel TFT is disposed on the insulating layer (lower insulating layer) covering the corresponding source bus line, and is connected to the source bus line within a contact hole (source contact hole) formed in the lower insulating layer. In the present specification, a connection portion that electrically connects the active layer of the pixel TFT and the source bus line is referred to as a "source contact portion".

As a result of a study by the present inventor, there is a problem that it is difficult to reduce the contact resistance of the source contact portion in the lower source structure substrate.

In a lower source structure substrate in the related art, for example, after forming a source contact hole that exposes a portion of the source bus line in the lower insulating layer, the exposed surface of the source bus line may be subject to process damage. As a result, good contact may not be obtained between the source bus line and the oxide semiconductor layer.

In a case where the oxide semiconductor TFT is used as a pixel TFT, the oxide semiconductor layer of the oxide semiconductor TFT is connected to the upper surface of the source bus line in the source contact portion. When the source bus line is formed of a low resistance metal film such as a Cu film in order to reduce the wiring resistance of the source bus line, since it is difficult to form an ohmic contact between a low resistance metal film such as a Cu film and the oxide semiconductor layer, it is difficult to suppress the contact resistance in the source contact portion small.

In order to reduce the contact resistance of the source contact portion, it is conceivable to use, for example, a multilayer film having a Cu film as a main layer and a Ti film as an upper layer as the source bus line. Since the Ti film can form an ohmic contact with the oxide semiconductor layer, the contact resistance with the oxide semiconductor layer can be reduced as compared with the case where the source bus line is formed only of the Cu film. However, when patterning such a multilayer film to form a source bus line, it is desired to separately dry-etch the Ti film after the Cu film is wet-etched, which increases the number of manufacturing steps.

SUMMARY

According to an embodiment of the present disclosure, there is provided an active matrix substrate including an oxide semiconductor TFT as a pixel TFT and capable of reducing the contact resistance between an oxide semiconductor layer of the oxide semiconductor TFT and a source bus line.

The present specification discloses an active matrix substrate and a method for manufacturing the active matrix substrate described in the following items.

[Item 1]

An active matrix substrate that includes a plurality of pixel regions, the active matrix substrate including a substrate; a plurality of gate bus lines supported on a main surface of the substrate, and a plurality of source bus lines located closer to the substrate side than the plurality of gate bus lines; a lower insulating layer that is located between the plurality of source bus lines and the plurality of gate bus lines and that covers the plurality of source bus lines; an interlayer insulating layer that covers the plurality of gate bus lines; a plurality of oxide semiconductor TFTs disposed in association with the plurality of pixel regions; and a pixel electrode disposed in each of the plurality of pixel regions, in which each of the plurality of oxide semiconductor TFTs includes an oxide semiconductor layer that is disposed on the lower insulating layer, and that has a channel region and a first region and a second region located on respective sides of the channel region, in which the first region is electrically connected to a corresponding one of the plurality of source bus lines, and the second region is electrically connected to the pixel electrode, a gate electrode disposed on a portion of the oxide semiconductor layer with a gate insulating layer in between, electrically connected to a corresponding one of the plurality of gate bus lines, and formed of a conductive film identical with a conductive film of the plurality of gate bus lines, and a source electrode electrically connected to a corresponding one of the plurality of source bus lines between the substrate and the lower insulating layer, and formed of a conductive film identical with a conductive film of the plurality of source bus lines, the active matrix substrate further includes a plurality of source contact portions each of which electrically connects one of the plurality of oxide semiconductor TFTs to the corresponding one of the source bus lines, and each of the source contact portions includes a source contact hole that is formed in the lower insulating layer and the interlayer insulating layer, that exposes a portion of the first region of the oxide semiconductor layer in the one of the plurality of oxide semiconductor TFTs and a portion of the source electrode, and that has a lower opening portion formed in the lower insulating layer and an upper opening portion formed in the interlayer insulating layer, and a connection electrode disposed on the interlayer insulating layer and in the source contact hole and connected to the portion of the first region and the portion of the source electrode in the source contact hole.

[Item 2]

A method for manufacturing an active matrix substrate that includes a plurality of pixel regions, a plurality of source bus lines, a plurality of gate bus lines, and a plurality of oxide semiconductor TFTs associated with the plurality of pixel regions, the method including in each of TFT forming regions where the plurality of oxide semiconductor TFTs are respectively formed, (a) forming a first metal layer including a source electrode of the oxide semiconductor TFT by forming a first conductive film on a substrate and patterning the first conductive film, the source electrode being integrally formed with a corresponding one of the plurality of source bus lines; (b) forming a lower insulating layer on the first metal layer; (c) forming an oxide semiconductor layer of the oxide semiconductor TFT on the lower insulating layer, and; (d) forming a gate insulating layer from a gate insulating film and forming a second metal layer having a gate electrode of the oxide semiconductor TFT from a second conductive film, by forming the gate insulating film and the second conductive film so as to cover the oxide semiconductor layer and patterning the gate insulating film and the second conductive film, the gate electrode being integrally formed with a corresponding one of the plurality of gate bus lines and being disposed on a portion of the oxide semiconductor layer with the gate insulating layer in between; (e) forming an interlayer insulating layer that covers the second metal layer; (f) forming a source contact hole that exposes a portion of the source electrode of the oxide semiconductor TFT and a portion of the oxide semiconductor layer of the oxide semiconductor TFT by patterning the interlayer insulating layer and the lower insulating layer; and (g) forming a connection electrode in contact with the portion of the source electrode and the portion of the oxide semiconductor layer in the source contact hole by forming a third conductive film on the interlayer insulating layer and in the source contact hole and patterning the third conductive film.

DESCRIPTION OF THE EMBODIMENTS

First Embodiment

Hereinafter, an active matrix substrate according to a first embodiment will be described with reference to the drawings.

Basic Structure of Active Matrix Substrate 101

Figure 1:
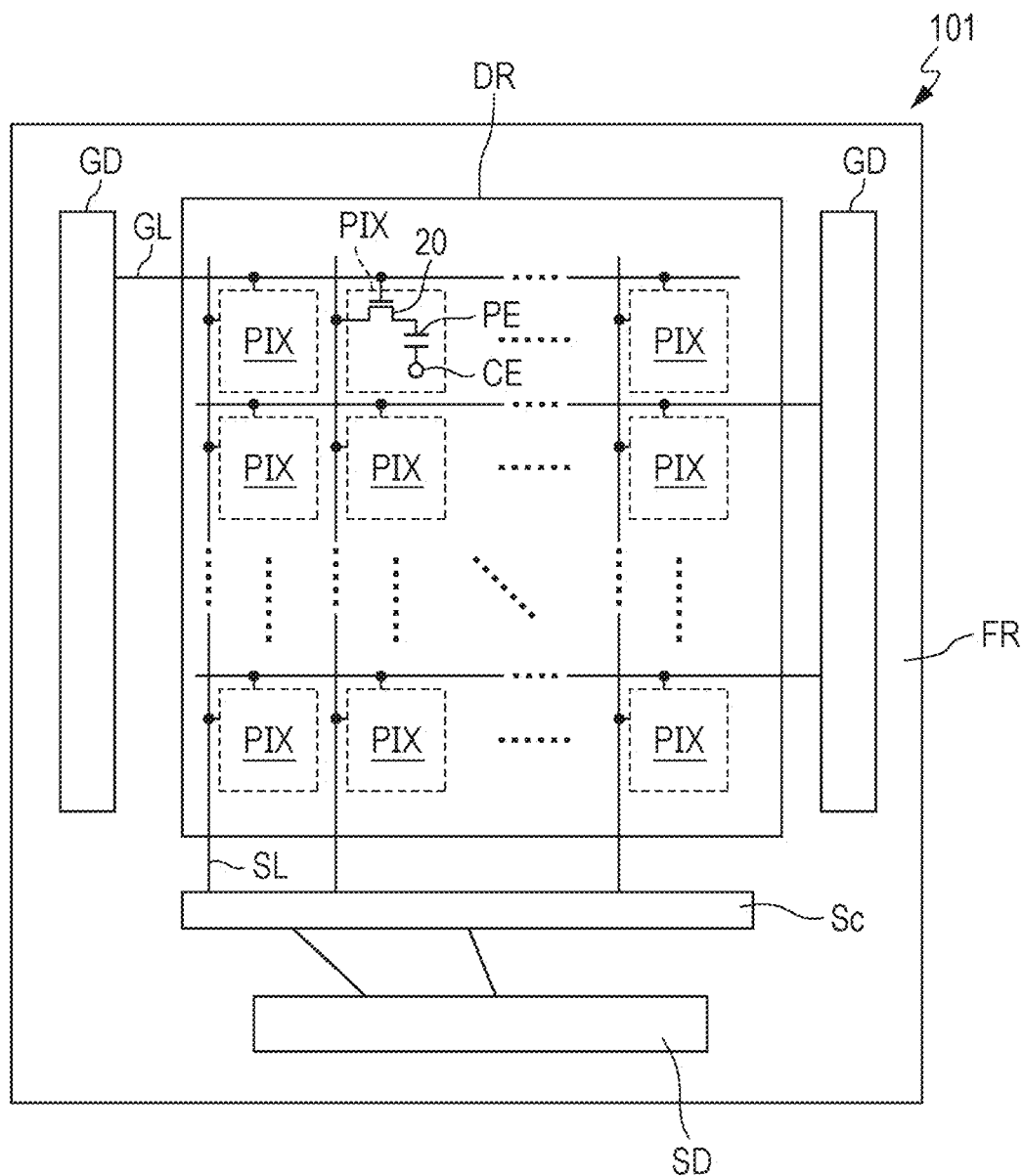
FIG. 1 is a schematic diagram illustrating an example of a planar structure of an active matrix substrate 101.

FIG. 1 is a plan view schematically illustrating an example of an active matrix substrate 101. The active matrix substrate 101 includes a display region DR contributing to display and a peripheral region (frame region) FR located outside the display region DR. The display region DR includes a plurality of pixel regions PIX arranged in a matrix. The pixel region PIX (simply, may be referred to as "pixel") is a region corresponding to a pixel of the display device. The non-display region FR is a region located around the display region DR and does not contribute to display.

In the display region DR, the active matrix substrate 101 is provided with a substrate 1, a plurality of pixel TFTs (hereinafter, simply TFT) 20 supported by the substrate 1, a plurality of pixel electrodes PE, a plurality of gate bus lines GL for supplying a gate signal to the TFT 20, and a plurality of source bus lines SL for supplying a source signal to the TFT 20. The TFT 20 is an oxide semiconductor TFT having an oxide semiconductor layer as an active layer.

Each of the pixel regions PIX is defined by, for example, the gate bus line GL and the source bus line SL. The source bus line SL extends in a direction intersecting with the gate bus line GL.

Each of the TFTs 20 and each of the pixel electrodes PE are provided corresponding to one of a plurality of pixel regions PIX. A gate electrode of the TFT 20 is electrically connected to one of the gate bus lines GL. A portion of the oxide semiconductor layer of the TFT 20 (referred to as a "first region") is electrically connected to one of the source bus lines SL. The other portion of the oxide semiconductor layer (referred to as a "second region") of the TFT 20 is electrically connected to the pixel electrode PE.

In a case where the active matrix substrate 101 is applied to a display device of a horizontal electric field mode such as a fringe field switching (FFS) mode, the active matrix substrate 101 is provided with a common electrode CE for a plurality of pixels PIX.

In the non-display region FR, a peripheral circuit such as a driver can be provided. In this example, a gate driver GD driving the gate bus line GL and an SSD circuit Sc driving the source bus line SL in a time division manner are monolithically formed. For example, the SSD circuit Sc is connected to a source driver SD implemented by a chip on glass (COG) method.

Structure of Pixel Region of Active Matrix Substrate 101

Hereinafter, a structure of the pixel region of the active matrix substrate according to the present embodiment will be described using an active matrix substrate applied to an FFS mode display device as an example with reference to the drawings. The FFS mode is a lateral electric field mode in which a pair of electrodes is provided on one substrate and an electric field is applied to liquid crystal molecules in a direction (lateral direction) parallel to a substrate surface.

In the following description, a layer including an electrode or wiring formed of the same conductive film (first conductive film) as the source bus line SL is referred to as a "first metal layer M1" (or "source metal layer"). A layer including an electrode or wiring formed of the same conductive film (second conductive film) as the gate bus line GL is referred to as "second metal layer M2" (or "gate metal layer"). The first metal layer M1 is located closer to the substrate than the second metal layer M2 (lower source structure). The active matrix substrate 101 of the present embodiment further includes a layer including an electrode or wiring formed of a third conductive film above the second metal layer M2. The layer formed of the third conductive film is referred to as a "third metal layer M3". In the present embodiment, the third metal layer M3 includes a drain electrode of the oxide semiconductor TFT.

In the drawings, after the reference numeral of each component, the layer in which the electrode or wiring is formed may be illustrated in parentheses. For example, the electrode or wiring formed in the first metal layer M1 may be labeled with "(M1)" after the reference numeral thereof.

Figure 2A:
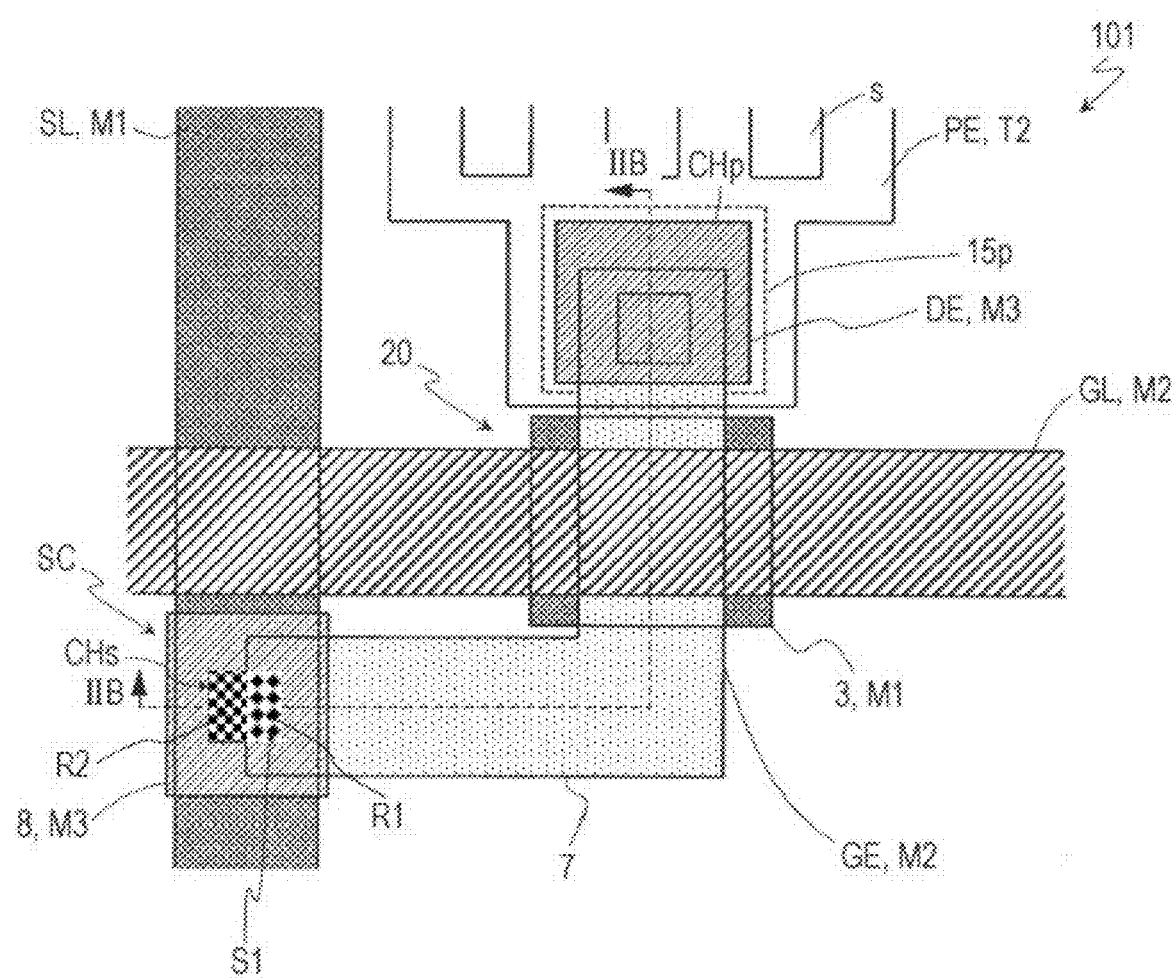
FIG. 2A is a plan view illustrating a pixel region in the active matrix substrate 101 according to a first embodiment.
Figure 2B:
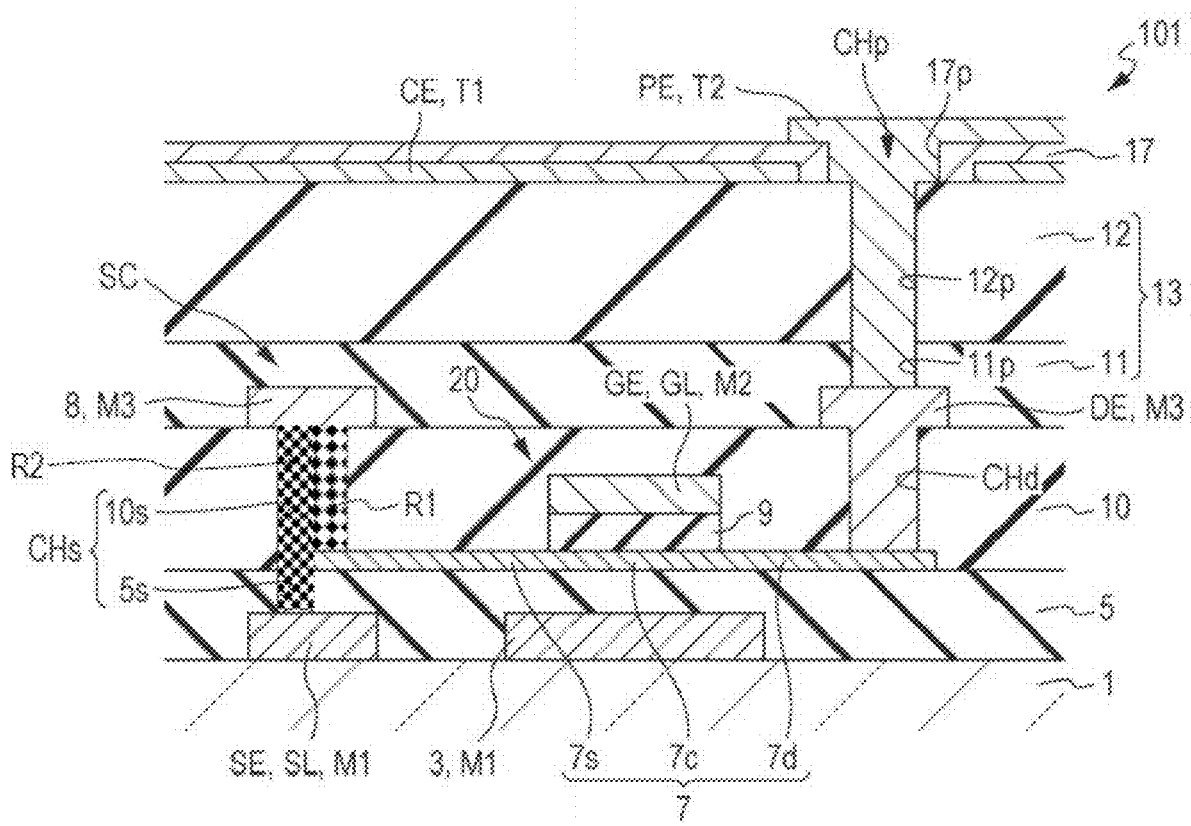
FIG. 2B is a cross-sectional view of the active matrix substrate 101 taken along the line IIB-IIB illustrated in FIG. 2A.

FIG. 2A is a plan view illustrating a pixel region in the active matrix substrate 101, and FIG. 2B is a cross-sectional view taken along the line IIB-IIB across the TFT 20 of the pixel region.

As illustrated in FIGS. 2A and 2B, the active matrix substrate 101 includes the substrate 1 having a main surface, the first metal layer M1 including the plurality of source bus lines SL extending in the column direction, the second metal layer M2 including the plurality of gate bus lines GL extending in the row direction, and a lower insulating layer 5. The first metal layer M1 is provided on the substrate 1 side than the second metal layer M2 (lower source structure). The lower insulating layer 5 is disposed between the first metal layer M1 and the second metal layer M2, and covers the first metal layer M1.

The active matrix substrate 101 also includes a plurality of top gate type TFTs 20, a plurality of pixel electrodes PE, and a plurality of source contact portions SC. Each of the TFTs 20, the pixel electrode PE, and the source contact portion SC is provided corresponding to each of the plurality of pixel regions. The active matrix substrate 101 further includes an interlayer insulating layer 10 covering the second metal layer M2, an upper insulating layer 13, and a common electrode CE.

The plurality of source bus lines SL are provided on the main surface of the substrate 1. The lower insulating layer 5 is provided so as to cover the first metal layer M1 including the source bus line SL.

Next, a configurations of the TFT 20 and the source contact portion SC in each pixel region will be described.

In each pixel region, the TFT 20 is provided with an oxide semiconductor layer 7 disposed on the lower insulating layer 5, a gate electrode GE disposed on a portion of the oxide semiconductor layer 7 with a gate insulating layer 9 in between, and a source electrode SE.

The oxide semiconductor layer 7 includes a channel region 7c, and a first region 7s and a second region 7d disposed on both sides thereof, respectively. The first region 7s and the second region 7d are low resistance regions having a lower specific resistance than that of the channel region 7c. The gate electrode GE is disposed so as to overlap the channel region 7c when viewed in the direction normal to the main surface of the substrate 1 (hereinafter, abbreviated as "direction normal to the substrate 1"). The gate insulating layer 9 may cover the channel region 7c and may not cover the first region 7s and the second region 7d.

The first region 7s of the oxide semiconductor layer 7 in the TFT 20 is electrically connected to the corresponding source bus line SL in the source contact portion SC described later. The second region 7d is electrically connected to the corresponding pixel electrode PE in a pixel contact portion described later.

The source electrode SE is formed using the same conductive film as that of the source bus line SL (that is, in the first metal layer M1). The source electrode SE is electrically connected to the corresponding source bus line SL. The source electrode SE may be integrally formed with the corresponding source bus line SL. For example, the source electrode SE may be a portion of the corresponding source bus line SL. In such a case, a portion of the source bus line SL located at the source contact portion SC is referred to as a "source electrode SE".

The gate electrode GE of the TFT 20 is formed using the same conductive film as that of the gate bus line GL (that is, in the second metal layer M2). The gate electrode GE is electrically connected to the corresponding gate bus line GL. The gate electrode GE may be integrally formed with the corresponding gate bus line GL. For example, the gate electrode GE may be a portion of the corresponding gate bus line GL. In such a case, a portion of the gate bus line GL overlapping the oxide semiconductor layer 7 when viewed in the direction normal to the substrate 1 is referred to as a "gate electrode GE".

In the illustrated example, the gate insulating layer 9 is formed only in a region overlapping the second metal layer M2 when viewed in the direction normal to the substrate 1. That is, an edge of the gate insulating layer 9 is aligned with an edge of the second metal layer M2.

The TFT 20 may have a light shielding layer 3 on the substrate 1 side of the oxide semiconductor layer 7. The light shielding layer 3 is formed in the first metal layer M1. The light shielding layer 3 may be disposed so as to overlap at least the channel region 7c in the oxide semiconductor layer 7 when viewed in the direction normal to the substrate 1. As a result, deterioration of characteristics of the oxide semiconductor layer 7 due to light (backlight light) from the substrate 1 side can be suppressed.

The interlayer insulating layer 10 is formed so as to cover the oxide semiconductor layer 7, the gate insulating layer 9, and the second metal layer M2. The interlayer insulating layer 10 may be in contact with the first region 7s and the second region 7d of the oxide semiconductor layer 7.

A drain electrode DE of the TFT 20 is formed on the interlayer insulating layer 10. The drain electrode DE is disposed on the interlayer insulating layer 10 and in the opening portion (drain contact hole) CHd provided in the interlayer insulating layer 10, and is connected to the second region 7d of the oxide semiconductor layer 7 in the drain contact hole CHd.

The source contact portion SC connects the first region 7s of the oxide semiconductor layer 7 of the TFT 20 and the corresponding source bus line SL. The source contact portion SC includes source contact holes CHs formed in the interlayer insulating layer 10 and the lower insulating layer 5 and exposing a portion of the source bus line SL and a portion of the first region 7s of the oxide semiconductor layer 7, and a connection electrode 8 formed using the same conductive film as that of the drain electrode DE (that is, in the third metal layer M3).

The source contact hole CHs includes a lower opening portion 5s formed in the lower insulating layer 5 and an upper opening portion 10s formed in the interlayer insulating layer 10. For example, the source contact holes CHs can be formed by etching the interlayer insulating layer 10 and the lower insulating layer 5 with the oxide semiconductor layer 7 as an etching stop. In this case, the side surface of the oxide semiconductor layer 7 is aligned with the side surface of the lower opening portion 5s in the source contact hole CHs. In the present embodiment, the edge (peripheral edge) of the oxide semiconductor layer 7 extends across the upper opening portion 10s when viewed in the direction normal to the substrate 1. When viewed in the direction normal to the substrate 1, the lower opening portion 5s is disposed inside the upper opening portion 10s and does not overlap the oxide semiconductor layer 7.

The connection electrode 8 is disposed on the interlayer insulating layer 10 and in the source contact hole CHs, and is connected to the exposed portion of the source bus line SL and the exposed portion of the first region 7s of the oxide semiconductor layer 7 (here, the upper surface and the side surface of the end portion of the first region 7s) in the source contact hole CHs. The connection electrode 8 may be in direct contact with both the source bus line SL and the first region 7s through a first connection region R1 and a second connection region R2 (as shown, for example, in FIGS. 2A, 2B 5A and 5B).

When viewed in the direction normal to the substrate 1, the ratio of an area S1 of the portion where the upper opening portion 10s and the oxide semiconductor layer 7 overlap each other (that is, contact area between the connection electrode 8 and the upper surface of the oxide semiconductor layer 7) to an entire area of the upper opening portion 10s may be, for example, ⅓ or more and ⅔ or less.

The upper insulating layer 13 is disposed so as to cover the interlayer insulating layer 10 and the third metal layer M3. The upper insulating layer 13 includes, for example, an inorganic insulating layer (passivation film) 11. As illustrated in the drawing, the upper insulating layer 13 may have a multilayer structure including the inorganic insulating layer 11 and an organic insulating layer 12 formed on the inorganic insulating layer 11. The organic insulating layer 12 may not be formed. Alternatively, the organic insulating layer 12 may be formed only in the display region.

The pixel electrode PE and the common electrode CE are disposed with a dielectric layer 17 in between. In this example, the pixel electrode PE is disposed on the common electrode CE with the dielectric layer 17 in between. A common electrode CE may be formed on the pixel electrode PE with the dielectric layer 17 in between. In the present specification, the electrode located on the substrate 1 side is referred to as a "lower transparent electrode", and the electrode disposed on the lower transparent electrode with the dielectric layer 17 in between is referred to as an "upper transparent electrode" of the common electrode CE and the pixel electrode PE. The layer including the lower transparent electrode is referred to as a "lower transparent conductive layer T1", and the layer including the upper transparent electrode is referred to as an "upper transparent conductive layer T2". The upper transparent electrode (pixel electrode PE in this example) is provided with one or more slits (opening portions) s or notched portions in each pixel region.

The pixel electrode PE is separated for each pixel region. The pixel electrode PE is electrically connected to the drain electrode DE of the corresponding TFT 10 in the pixel contact portion. In the present embodiment, the pixel electrode PE is disposed on the dielectric layer 17, and is connected to the drain electrode DE in the pixel contact hole CHp formed in the upper insulating layer 13 and the dielectric layer 17. The pixel contact hole CHp is configured to include an opening portion 11p of the inorganic insulating layer 11, an opening portion 12p of the organic insulating layer 12, and an opening portion 17p of the dielectric layer 17.

The common electrode CE may not be separated for each pixel region. For example, the common electrode CE may include an opening portion 15p in a region (pixel contact portion) where the pixel contact hole CHp is formed, and may be formed over the entire pixel region excluding the pixel contact portion.

Method for Manufacturing Active Matrix Substrate 101

Next, an example of a method for manufacturing the active matrix substrate 101 of the present embodiment will be described with reference to the drawings. Hereinafter, a manufacturing method will be described for one pixel region of the plurality of pixel regions in the active matrix substrate 101.

FIGS. 3A to 3L are schematic step sectional views for describing a method for manufacturing the active matrix substrate 101. These drawings illustrate a region (TFT forming region) where a TFT is formed in one pixel region.

Figure 3A:
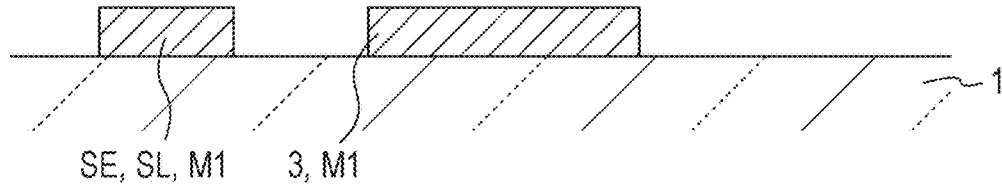
FIG. 3A is a step sectional view illustrating a method for manufacturing the active matrix substrate 101.

Step 1: Formation of First Metal Layer M1 (FIG. 3A)

A first conductive film (thickness: for example, 50 nm or more and 500 nm or less) is formed on the substrate 1 by, for example, a sputtering method. Next, the first conductive film is patterned by a known photolithography step. Here, a resist layer (not illustrated) is formed by forming a resist film on the first conductive film and exposing the resist film with a photomask for a source. Etching (for example, wet etching) of the first conductive film is performed using the resist layer as a mask.

As described above, as illustrated in FIG. 3A, the first metal layer M1 including the light shielding layer 3 of the source bus line SL and the TFT is formed. The source bus line SL includes a portion that functions as a source electrode SE of the TFT.

As the substrate 1, a transparent and insulating substrate, for example, a glass substrate, a silicon substrate, a plastic substrate (resin substrate) having heat resistance, or the like can be used.

The material of the first conductive film is not particularly limited, and a film containing a metal such as aluminum (Al), tungsten (W), molybdenum (Mo), tantalum (Ta), chromium (Cr), titanium (Ti), or and copper (Cu), an alloy thereof, or a metal nitride thereof can be appropriately used. A multilayer film in which a plurality of these films are stacked may be used.

Here, a single-layer film of a metal film (including an alloy film) containing Cu or Al is used as the first conductive film. Alternatively, a multilayer film having a metal film containing Cu or Al as the uppermost layer may be used. As described above, in the present embodiment, the contact resistance between the source bus line SL (source electrode SE) and the oxide semiconductor can be reduced without providing an ohmic conductive film such as a Ti film on the Cu film or Al film.

Step 2: Formation of Lower Insulating Layer 5 (FIG. 3B)

Figure 3B:
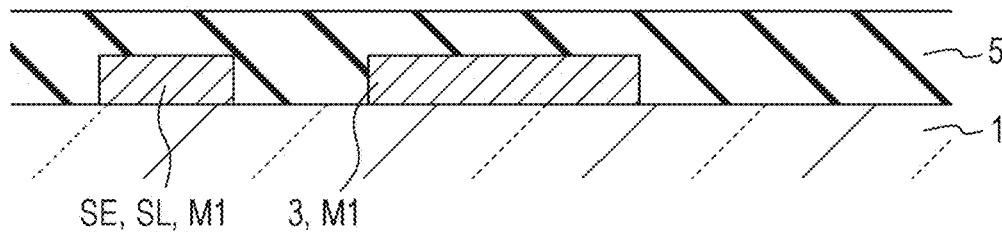
FIG. 3B is a step sectional view illustrating a method for manufacturing the active matrix substrate 101.

Next, as illustrated in FIG. 3B, a lower insulating layer 5 (thickness: for example, 200 nm or more and 600 nm or less) is formed so as to cover the first metal layer M1.

The lower insulating layer 5 is formed by, for example, a CVD method. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like can be appropriately used. The lower insulating layer 5 may be a single layer or may have a multilayer structure. For example, a silicon nitride (SiNx) layer, a silicon nitride oxide layer, or the like may be formed on the substrate side (lower layer) to restrain diffusion of impurities and the like from the substrate 1, and a silicon oxide ($SiO_2$) layer, a silicon oxynitride layer, or the like may be formed on a layer thereover (upper layer) to secure insulation. Here, as the lower insulating layer 5, for example, a silicon oxide ($SiO_2$) layer (thickness: 350 nm, for example) is formed by using the CVD method. Alternatively, as the lower insulating layer 5, a multilayer film having a silicon nitride (SiNx) layer (thickness: 50 to 600 nm) as a lower layer and a silicon oxide ($SiO_2$) layer (thickness: 50 to 600 nm) as an upper layer may be formed. In a case where an oxide film such as a silicon oxide film is used as the lower insulating layer 5 (in a case where the lower insulating layer 5 has a multilayer structure, as an uppermost layer), since oxidation deficiency generated in a channel region of an oxide semiconductor layer formed later can be reduced by the oxide film, reduction in resistance of the channel region can be suppressed.

Figure 3C:
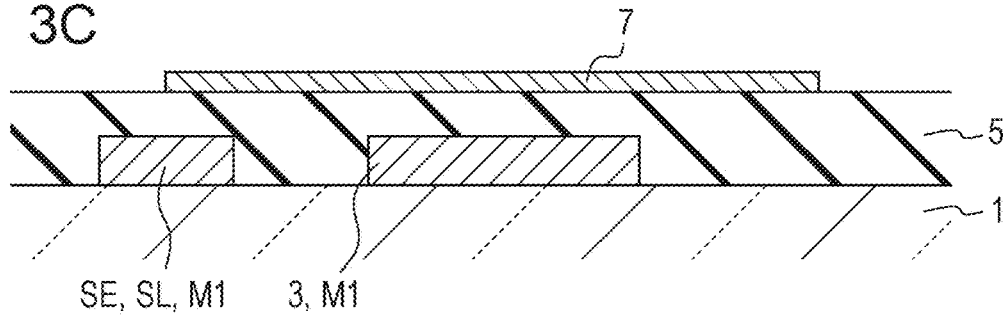
FIG. 3C is a step sectional view illustrating a method for manufacturing the active matrix substrate 101.

Step 3: Formation of Oxide Semiconductor Layer 7 (FIG. 3C)

Subsequently, an oxide semiconductor film (thickness: for example, 15 nm or more and 200 nm or less) is formed on the lower insulating layer 5. Thereafter, annealing treatment of the oxide semiconductor film may be performed. Subsequently, the oxide semiconductor film is patterned by a known photolithography step. As a result, as illustrated in FIG. 3C, an oxide semiconductor layer 7 to be an active layer of the TFT 20 is obtained.

The oxide semiconductor film can be formed by, for example, a sputtering method. Here, an In—Ga—Zn—O-based semiconductor film (thickness: 50 nm) containing In, Ga, and Zn is formed as the oxide semiconductor film.

The patterning of the oxide semiconductor film may be performed by wet etching using a PAN-based etching solution containing phosphoric acid, nitric acid, and acetic acid, for example. Alternatively, another etching solution such as an oxalic acid-based etching solution may be used.

Step 4: Formation of Gate Insulating Film 90 (FIG. 3D)

Figure 3D:
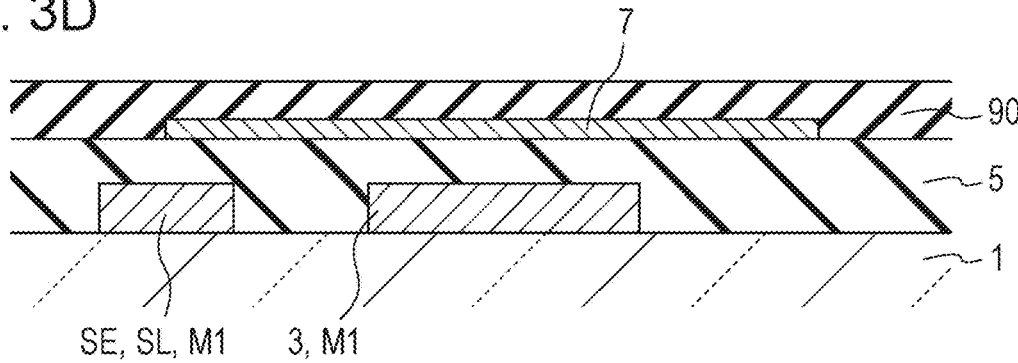
FIG. 3D is a step sectional view illustrating a method for manufacturing the active matrix substrate 101.

Next, as illustrated in FIG. 3D, a gate insulating film 90 is formed so as to cover the oxide semiconductor layer 7.

As the gate insulating film 90, an insulating film similar to the lower insulating layer 5 (insulating film exemplified as the lower insulating layer 5) can be used. Here, a silicon oxide ($SiO_2$) film is formed as the gate insulating film 90. When an oxide film such as a silicon oxide film is used as the gate insulating film 90, since oxidation deficiency generated in the channel region of the oxide semiconductor layer 7 can be reduced by the oxide film, reduction in resistance of the channel region can be suppressed.

Figure 3E:
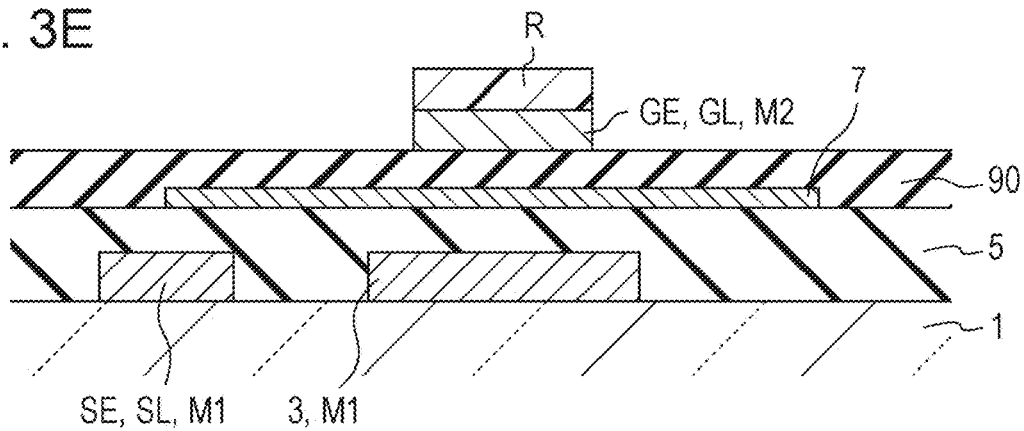
FIG. 3E is a step sectional view illustrating a method for manufacturing the active matrix substrate 101.

Step 5: Formation of Second Metal Layer M2 (FIG. 3E)

Next, a second conductive film (thickness: for example, 50 nm or more and 500 nm or less) (not illustrated) is formed on the gate insulating film 90. Thereafter, the second conductive film is patterned by a known photolithography step. Here, a resist layer R is formed by forming a resist film on the second conductive film and exposing the resist film with a photomask for a gate. Etching (for example, wet etching) of the second conductive film is performed using the resist layer R as a mask. As a result, a second metal layer M2 including the gate bus line GL is obtained. The gate bus line GL includes a portion that functions as a gate electrode GE of the TFT.

As the second conductive film, for example, a metal such as molybdenum (Mo), tungsten (W), aluminum (Al), copper (Cu), titanium (Ti), tantalum (Ta), or an alloy thereof can be used. The second conductive film may have a multilayer structure including a plurality of layers formed of different conductive materials. Here, as the second conductive film, a Cu and Ti multilayer film having a Ti film as a lower layer and a Cu film as an upper layer, or a Cu and Mo multilayer film having a Mo film as a lower layer and a Cu film as an upper layer is used.

Figure 3F:
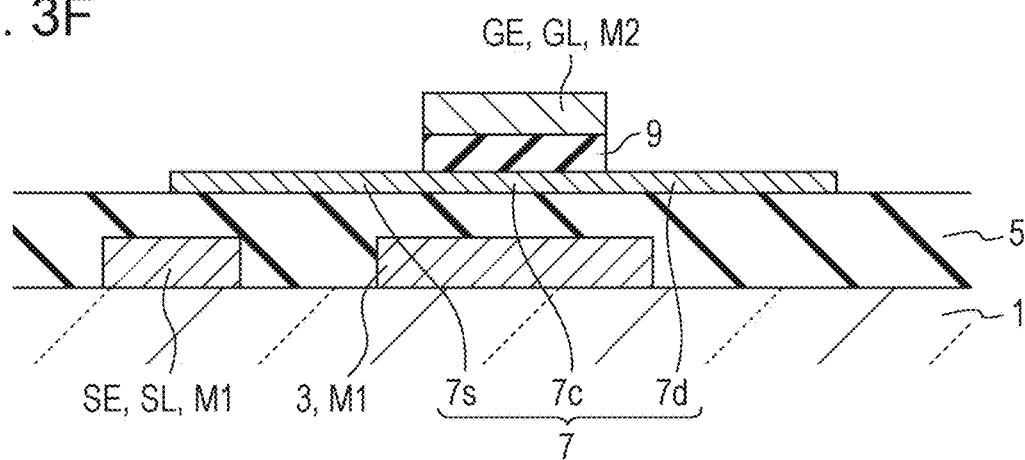
FIG. 3F is a step sectional view illustrating a method for manufacturing the active matrix substrate 101.

Step 6: Patterning of Gate Insulating Layer 9 (FIG. 3F)

Next, the gate insulating film 90 is patterned using the resist layer R as a mask or the second metal layer M2 as a mask to form the gate insulating layer 9. According to this method, the side surface of the gate electrode GE and the side surface of the gate insulating layer 9 are aligned with each other when viewed in the direction normal to the substrate 1.

The gate insulating film 90 and the second conductive film may be patterned separately. Specifically, before forming the second conductive film, the gate insulating film 90 is patterned to form the gate insulating layer 9. Next, the second conductive film may be formed so as to cover the gate insulating layer 9, and the second conductive film may be patterned to form the second metal layer M2. Alternatively, after the gate insulating film 90 is formed, the second conductive film is formed and the second conductive film is patterned. Thereafter, the gate insulating film 90 may be patterned to form the gate insulating layer 9.

Figure 3G:
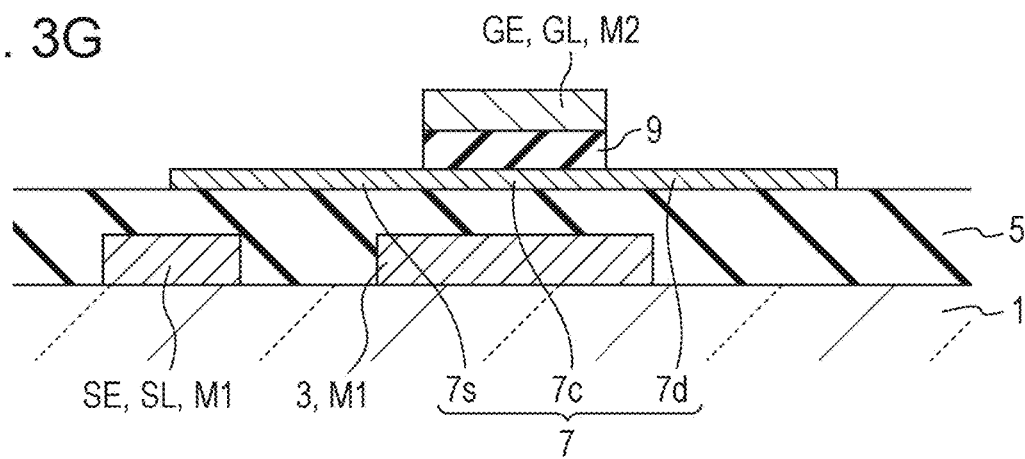
FIG. 3G is a step sectional view illustrating a method for manufacturing the active matrix substrate 101.

Step 7: Resistance Lowering Treatment of Oxide Semiconductor Layer 7 (FIG. 3G)

Subsequently, a resistance lowering treatment of the oxide semiconductor layer 7 is performed. For example, as the resistance lowering treatment, a plasma treatment may be performed. As a result, as illustrated in FIG. 3G, when viewed in the direction normal to the main surface of the substrate 1, a region (exposed region) of the oxide semiconductor layer 7, which does not overlap the gate bus line GL (or gate electrode GE) or the gate insulating layer 9 is a low resistance region having a lower specific resistance than that of a region that overlaps these line and layer (here, region to be the channel). The low resistance region may be a conductor region (for example, sheet resistance: 200 Ω/or less). AS described above, the oxide semiconductor layer 7 including the first region 7s and the second region 7d, which are low resistance regions, and the channel region 7c remaining as a semiconductor region without being reduced in resistance is obtained.

The method of resistance lowering treatment (plasma treatment) is not limited to the above. For example, the resistance of the exposed region of the oxide semiconductor layer 7 may be lowered by a reducing plasma or a plasma containing a doping element (for example, argon plasma). The method and conditions for the resistance lowering treatment are described in, for example, Japanese Unexamined Patent Application Publication No. 2008-40343. For reference, the entire content of the disclosure of Japanese Unexamined Patent Application Publication No. 2008-40343 is incorporated herein.

Figure 3H:
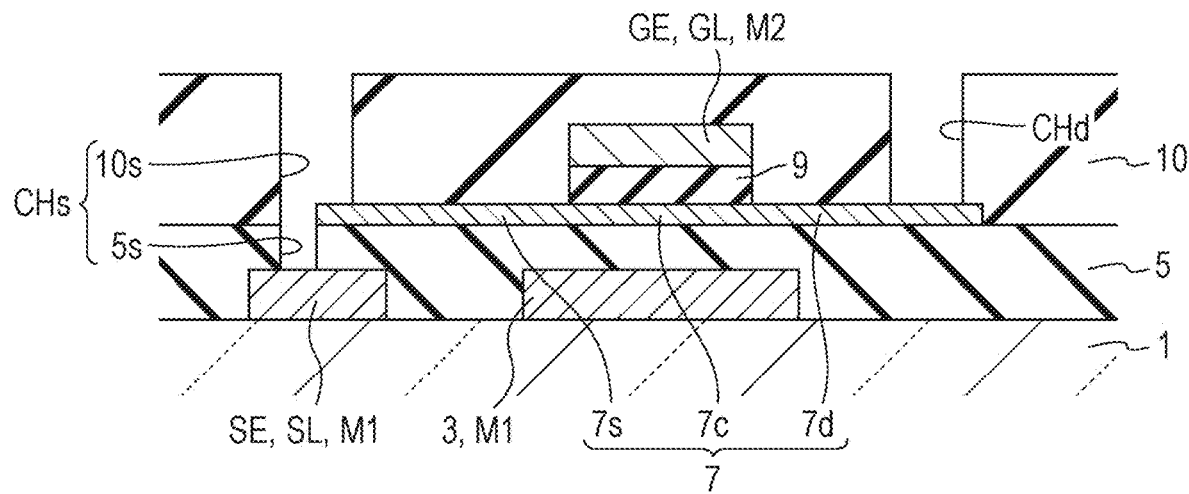
FIG. 3H is a step sectional view illustrating a method for manufacturing the active matrix substrate 101.

Step 8: Formation of Interlayer Insulating Layer 10 (FIG. 3H)

Next, an interlayer insulating layer 10 covering the oxide semiconductor layer 7, the gate insulating layer 9, and the gate electrode GE is formed. Thereafter, the interlayer insulating layer 10 and the lower insulating layer 5 are patterned by a known photolithography step. As a result, as illustrated in FIG. 3H, a drain contact hole CHd that exposes a portion of the second region 7d of the oxide semiconductor layer 7 is formed in the interlayer insulating layer 10, and the source contact holes CHs that expose a portion of the source bus line SL (or source electrode SE) and a portion of the first region 7s of the oxide semiconductor layer 7 are formed in the interlayer insulating layer 10 and the lower insulating layer 5.

As the interlayer insulating layer 10, an inorganic insulating layer such as a silicon oxide film, a silicon nitride film, a silicon oxynitride film, a silicon nitride oxide film, or the like can be formed as a single layer or a multilayer. The thickness of the inorganic insulating layer may be 100 nm or more and 500 nm or less. When the interlayer insulating layer 10 is formed using an insulating film such as a silicon nitride film that reduces an oxide semiconductor, this is desirable because the specific resistance of a region (here, a low resistance region) in contact with the interlayer insulating layer 10 in the oxide semiconductor layer 7 can be maintained low. Here, as the interlayer insulating layer 10, for example, a SiNx layer (thickness: 300 nm) is formed by a CVD method.

In a case where an insulating layer that can reduce an oxide semiconductor (for example, hydrogen-donating layer such as a silicon nitride layer) is used as the interlayer insulating layer 10, even without performing the above-described resistance lowering treatment, a portion of the oxide semiconductor layer 7 that is in contact with the interlayer insulating layer 10 can have a lower resistance than a portion that is not in contact.

The patterning of the interlayer insulating layer 10 and the lower insulating layer 5 can be performed by, for example, dry etching. The dry etching is performed under the condition that the oxide semiconductor layer 7 is not etched and only these insulating layers are etched. As a result, since the oxide semiconductor layer 7 functions as an etch stop, a portion of the side surface of the lower opening portion 5s formed in the lower insulating layer 5 is aligned with the side surface of the oxide semiconductor layer 7, and the other portion is aligned with the side surface of the upper opening portion 10s in the source contact hole CHs.

In the present embodiment, for example, carbon tetrachloride ($CF_4$) gas and oxygen ($O_2$) gas ($CF_4/O_2$) are used as the etching gas in the patterning step of the interlayer insulating layer 10 and the lower insulating layer 5. An inert gas such as Ar gas may be added as appropriate. The etching conditions (type of etching gas, substrate temperature, degree of vacuum in the chamber, and the like) are set to conditions capable of suppressing damage to the oxide semiconductor layer 7. As an example, in a case where $CF_4/O_2$ is used as the etching gas, when the flow rate of the $O_2$ gas is increased (for example, the flow rate ratio of the $O_2$ gas to the $CF_4$ gas is approximately 10% to 25%), since the surface of the oxide semiconductor layer 7 is unlikely to be scraped, damage to the oxide semiconductor layer 7 can be reduced.

Figure 3I:
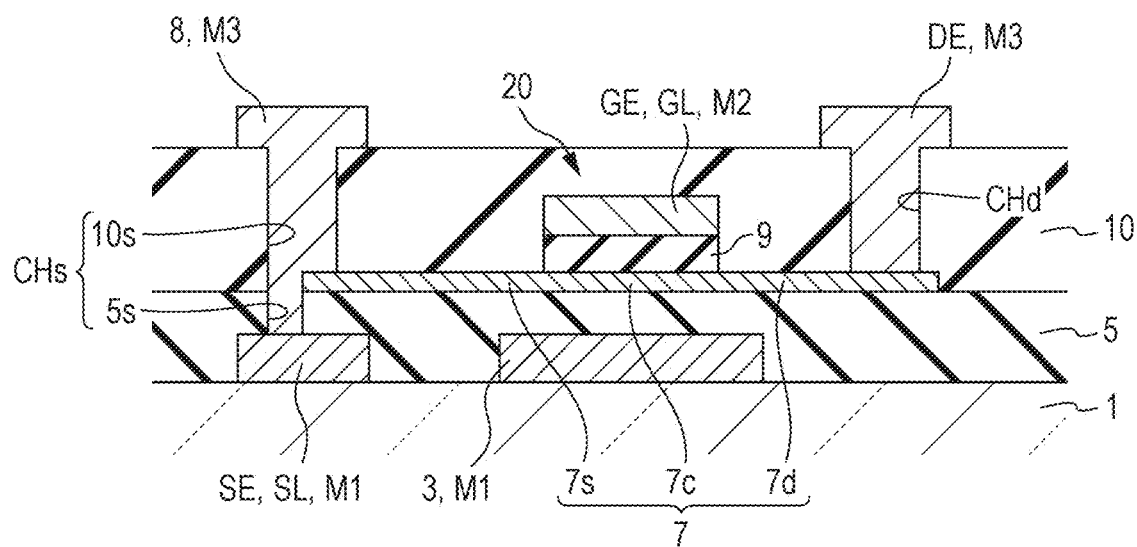
FIG. 3I is a step sectional view illustrating a method for manufacturing the active matrix substrate 101.

Step 9: Formation of Third Metal Layer M3 (FIG. 3I)

Next, a third conductive film (thickness: for example, 50 nm or more and 500 nm or less) (not illustrated) is formed on the interlayer insulating layer 10, and the third conductive film is patterned. As a result, as illustrated in FIG. 3I, the third metal layer M3 including the connection electrode 8 and the drain electrode DE is formed.

The connection electrode 8 is disposed on the interlayer insulating layer 10 and in the source contact hole CHs, and is connected to the source bus line SL (or source electrode SE) and the first region 7s of the oxide semiconductor layer 7 in the source contact hole CHs. In this example, the connection electrode 8 is in direct contact with the source bus line SL and the first region 7s.

The drain electrode DE is disposed on the interlayer insulating layer 10 and in the drain opening portion 10p, and is connected to the second region 7d of the oxide semiconductor layer 7 in the drain opening portion 10p. In this example, the drain electrode DE is in direct contact with the second region 7d.

As the third conductive film, for example, an element selected from aluminum (Al), chromium (Cr), copper (Cu), tantalum (Ta), titanium (Ti), molybdenum (Mo), or tungsten (W), or an alloy containing these elements as components can be used. For example, the third conductive film may have a three-layer structure of a titanium film-aluminum film-titanium film, a three-layer structure of a molybdenum film-aluminum film-molybdenum film, or the like. The third conductive film is not limited to the three-layer structure, and may have a single layer, a two-layer structure, or a multilayer structure of four or more layers. Here, a multilayer film in which a Ti film (thickness: 15 to 70 nm) is a lower layer and a Cu film (thickness: 50 to 400 nm) is an upper layer is used. When a multilayer film having an ohmic conductive film as the lowermost layer such as a Ti film is used, the contact resistance of the source contact portion can be reduced more effectively.

Step 10: Formation of Inorganic Insulating Layer 11 and Organic Insulating Layer 12 (FIG. 3J)

Figure 3J:
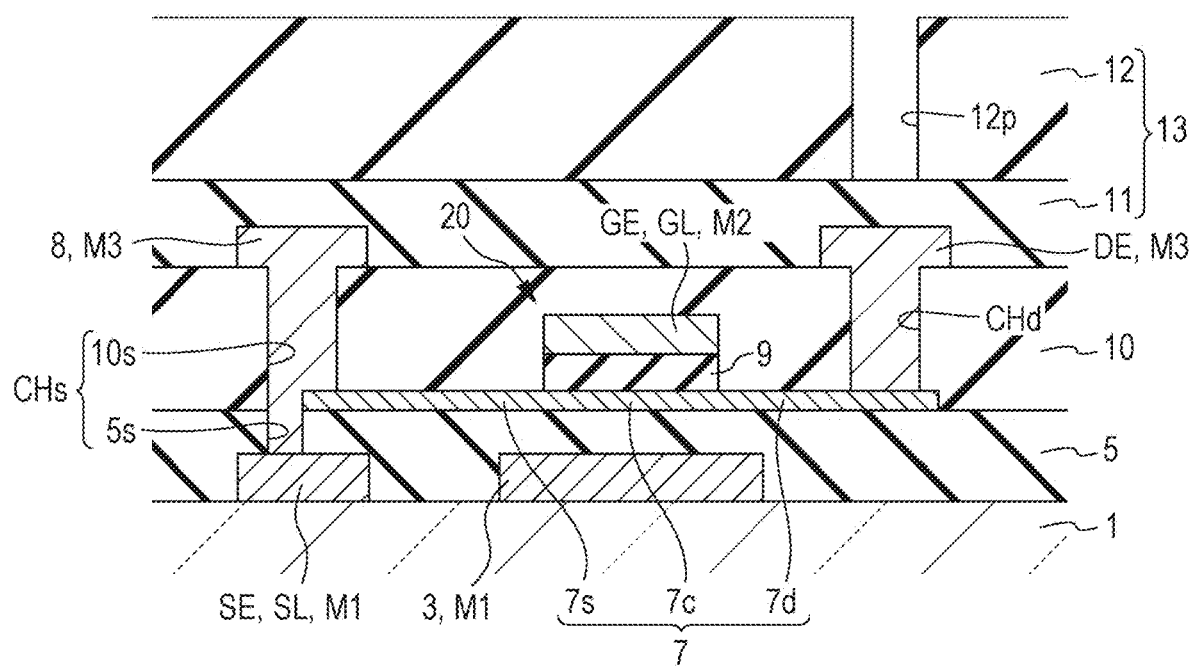
FIG. 3J is a step sectional view illustrating a method for manufacturing the active matrix substrate 101.

Next, as illustrated in FIG. 3J, an upper insulating layer 13 is formed so as to cover the interlayer insulating layer 10 and the third metal layer M3. Here, as the upper insulating layer 13, an inorganic insulating layer 11 (thickness: for example, 100 nm or more and 500 nm or less) and an organic insulating layer 12 (thickness: for example, 1 to 4 μm, desirably 2 to 3 μm) are formed in this order.

As the inorganic insulating layer 11, the inorganic insulating film similar to the interlayer insulating layer 10 can be used. Here, as the inorganic insulating layer 11, for example, a SiNx layer (thickness: 300 nm) is formed by a CVD method. The organic insulating layer 12 may be, for example, an organic insulating film (for example, acrylic resin film) containing a photosensitive resin material.

Thereafter, the organic insulating layer 12 is patterned. As a result, in each pixel region, an opening portion 12p exposing a portion of the inorganic insulating layer 11 is formed in the organic insulating layer 12. The opening portion 12p is disposed so as to overlap the drain electrode DE when viewed in the direction normal to the substrate 1. By this patterning, the entire portion of the organic insulating layer 12 located in the non-display region may be removed.

Step 11: Formation of Common Electrode CE (FIG. 3K)

Figure 3K:
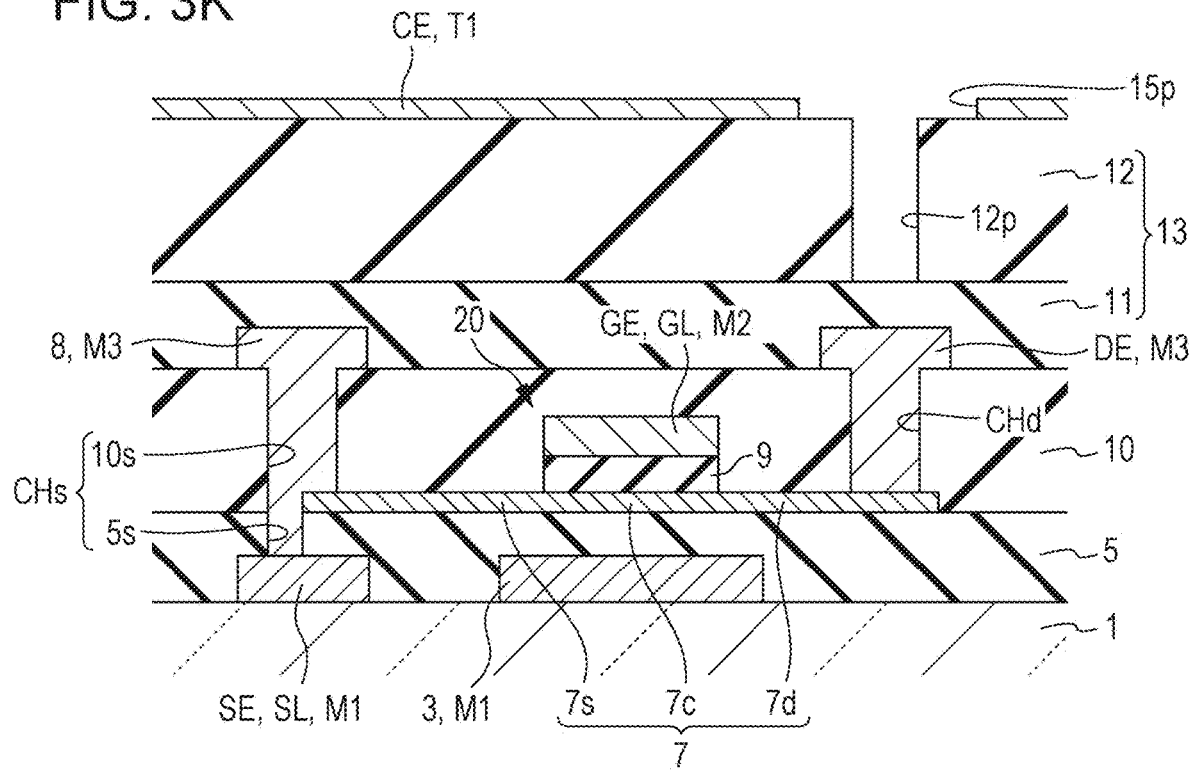
FIG. 3K is a step sectional view illustrating a method for manufacturing the active matrix substrate 101.

Subsequently, as illustrated in FIG. 3K, a common electrode CE is formed on the upper insulating layer 13.

First, a first transparent conductive film (thickness: 20 to 300 nm) (not illustrated) is formed on the upper insulating layer 13 and in the opening portion 12p. Here, for example, an indium-zinc oxide film is formed as the first transparent conductive film by a sputtering method. As the material of the first transparent conductive film, metal oxides such as indium-tin oxide (ITO), indium-zinc oxide, and ZnO can be used. Thereafter, the first transparent conductive film is patterned. In patterning, for example, wet etching may be performed using an oxalic acid-based etching solution. As a result, a common electrode CE is obtained. The common electrode CE may have an opening portion 15p, for example, on the region where the pixel contact hole is formed.

Step 12: Formation of Dielectric Layer 17 (FIG. 3L)

Figure 3L:
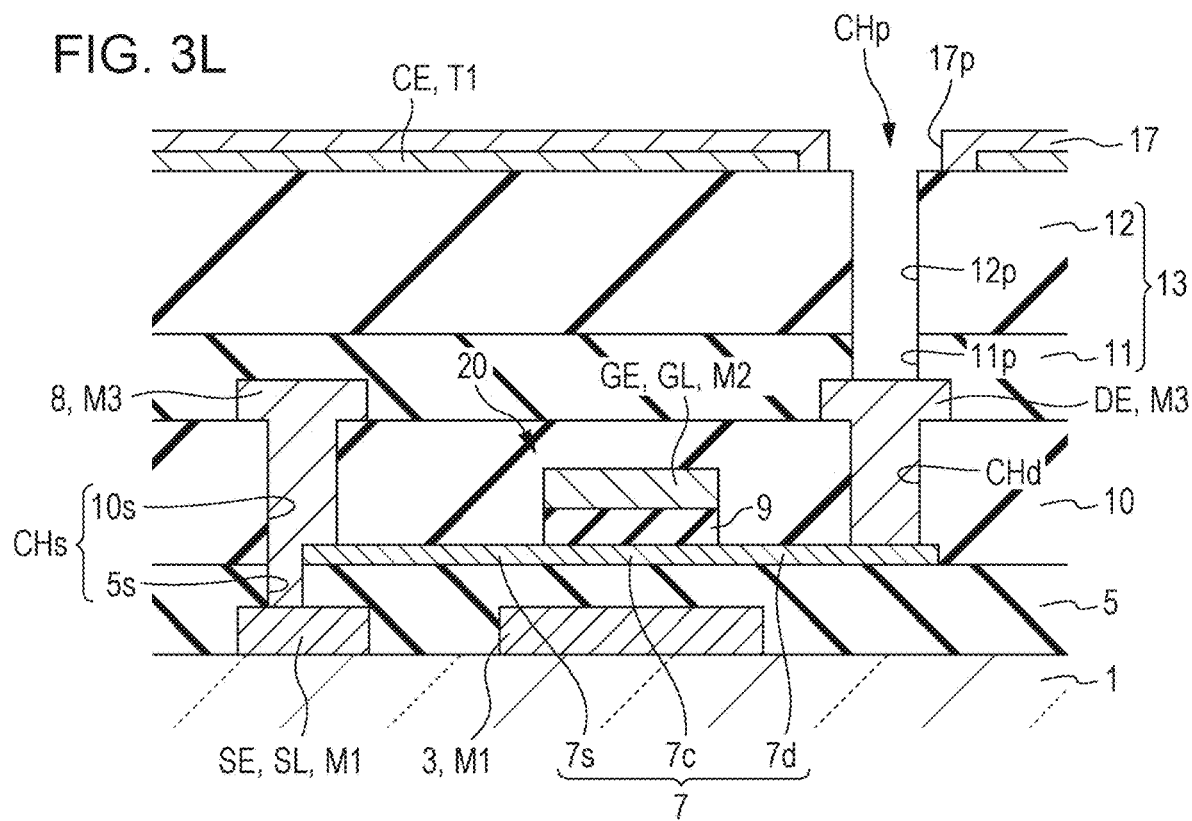
FIG. 3L is a step sectional view illustrating a method for manufacturing the active matrix substrate 101.

Next, as illustrated in FIG. 3L, a dielectric layer (thickness: 50 to 500 nm) 17 is formed so as to cover the common electrode CE, and the dielectric layer 17 and the inorganic insulating layer 11 are patterned.

The dielectric layer 17 is formed on the organic insulating layer 12 and the common electrode CE and in the opening portion 12p in the pixel region. The material of the dielectric layer 17 may be the same as the material exemplified as the material of the inorganic insulating layer 11. Here, a SiN film is formed as the dielectric layer 17 by, for example, a CVD method.

Thereafter, the dielectric layer 17 and the inorganic insulating layer 11 are etched by a known photolithography step to form a pixel contact hole CHp that exposes the drain electrode DE. The pixel contact hole CHp includes the opening portion 17p of the dielectric layer 17, the opening portion 12p of the organic insulating layer 12, and the opening portion 11p of the inorganic insulating layer 11. The opening portion 17p may be at least partially overlapped the opening portion 12p when viewed in the direction normal to the substrate 1. The opening portion 11p is etched using the resist layer (not illustrated) on the dielectric layer 17 and the organic insulating layer 12 as masks.

Step 13: Formation of Pixel Electrode PE (FIGS. 2A and 2B)

Next, a second transparent conductive film (not illustrated) (thickness: 20 to 300 nm) is formed on the dielectric layer 17 and in the pixel contact hole CHp. The second transparent conductive film can be formed by using the same material as that of the first transparent conductive film.

Thereafter, the second transparent conductive film is patterned. Here, for example, the second transparent conductive film is wet-etched using an oxalic acid-based etching solution. As a result, the pixel electrode PE is formed in each pixel region. The pixel electrode PE is connected to the drain electrode DE in the pixel contact hole CHp. AS described above, the active matrix substrate 101 illustrated in FIGS. 2A and 2B is manufactured.

According to the active matrix substrate 101 of the present embodiment, it is possible to reduce the contact resistance of the source contact portion as compared with the lower source structure substrate in the related art. In the lower source structure substrate in the related art, a portion of the oxide semiconductor layer 7 may be lost due to a forming process of the source contact portion, and such a problem does not occur in the present embodiment. Furthermore, in the present embodiment, since the source contact hole CHs are performed in the same etching step as that of the drain contact hole CHd, the number of photomasks used can be reduced as compared with the case in the related art.

In order to describe the above-described effect by the present embodiment in more detail, first, a method for manufacturing a lower source structure substrate of a reference example will be described.

FIGS. 12A to 12E are step sectional views illustrating a step of forming a source contact portion in the lower source structure substrate according to the reference example. In the reference example, the source contact portion has a structure in which the oxide semiconductor layer and the source bus line are in direct contact with each other in the source opening portion formed in the lower insulating layer.

Figure 12A:
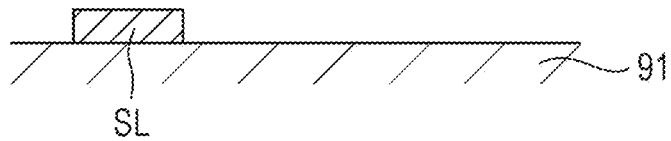
FIG. 12A is a step sectional view illustrating a method for forming a source contact portion according to a reference example.

First, as illustrated in FIG. 12A, a source bus line SL is formed by forming the first conductive film on the substrate 91 and patterning the first conductive film.

Figure 12B:
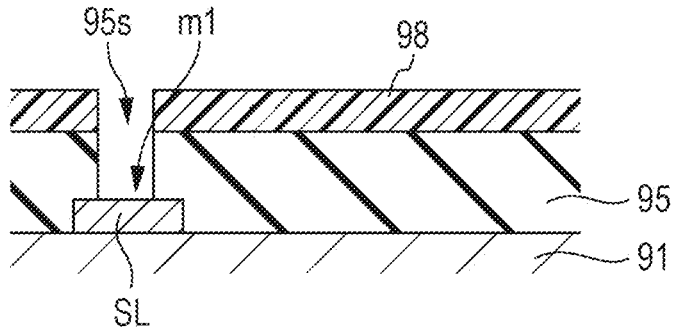
FIG. 12B is a step sectional view illustrating a method for forming the source contact portion according to the reference example.

Subsequently, as illustrated in FIG. 12B, a lower insulating layer 95 covering the source bus line SL is formed. Thereafter, a resist layer 98 is formed on the lower insulating layer 95 by a known photolithography step. Using this resist layer 98 as a mask, the lower insulating layer 95 is etched to form a source opening portion 95s that exposes a portion of the surface m1 of the source bus line SL.

As described above, the surface m1 of the source bus line SL is a low resistance metal film such as a Cu film or an Al film. It is desirable not to form an ohmic conductive film such as a Ti film on the low resistance metal film. This is because when the Ti film is formed, it is desired to separately pattern the low resistance metal film by wet etching and the Ti film by dry etching, which complicates the manufacturing process.

Figure 12C:
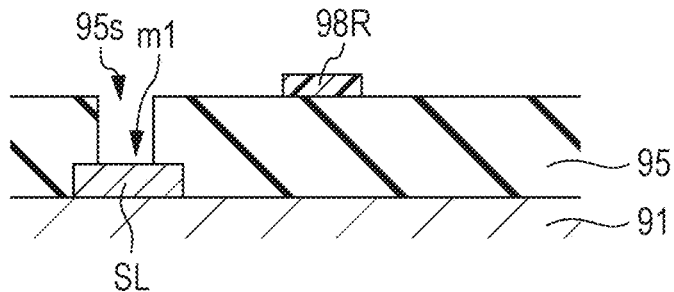
FIG. 12C is a step sectional view illustrating a method for forming the source contact portion according to the reference example.

After etching the lower insulating layer 95, the resist layer 98 is stripped from the substrate 91 as illustrated in FIG. 12C. At this time, the resist layer 98 formed on the lower insulating layer 95 is difficult to be stripped, and a portion of the resist layer 98 may remain on the lower insulating layer 95 without being stripped. A remaining portion 98R of the resist layer 98 is referred to as "resist residue".

Figure 12D:
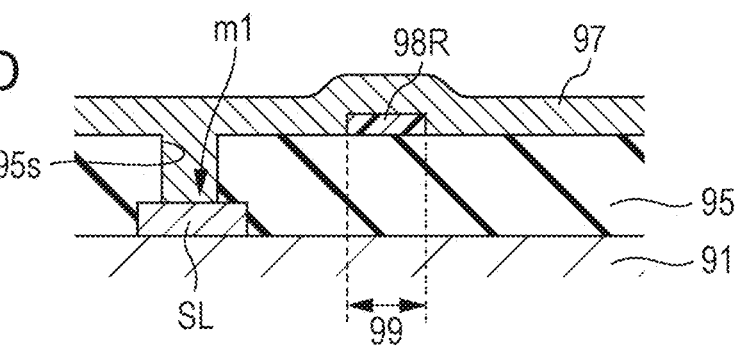
FIG. 12D is a step sectional view illustrating a method for forming the source contact portion according to the reference example.

Subsequently, as illustrated in FIG. 12D, an oxide semiconductor layer 97 is obtained by forming an oxide semiconductor film (for example, an In—Ga—Zn—O-based semiconductor film) on the lower insulating layer 95 and in the source opening portion 95s, and patterning the oxide semiconductor film. The oxide semiconductor layer 97 is in direct contact with the exposed surface m1 of the source bus line SL within the source opening portion 95s.

Figure 12E:
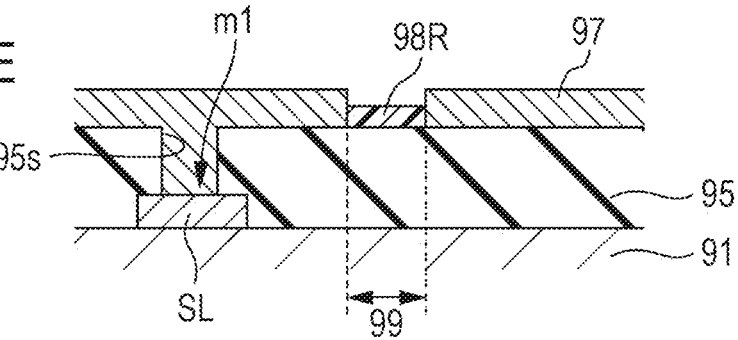
FIG. 12E is a step sectional view illustrating a method for forming the source contact portion according to the reference example.

At this time, when the resist residue 98R is generated, the adhesion between the oxide semiconductor film and the resist residue 98R is low. Therefore, as illustrated in FIG. 12E, the portion of the oxide semiconductor film located on the resist residue 98R may be stripped, and a defect 99 may be generated in the oxide semiconductor film. As a result, the oxide semiconductor layer 97 having a predetermined shape cannot be obtained, and the TFT characteristics may be deteriorated or the disconnection may be generated.

Figure 13:
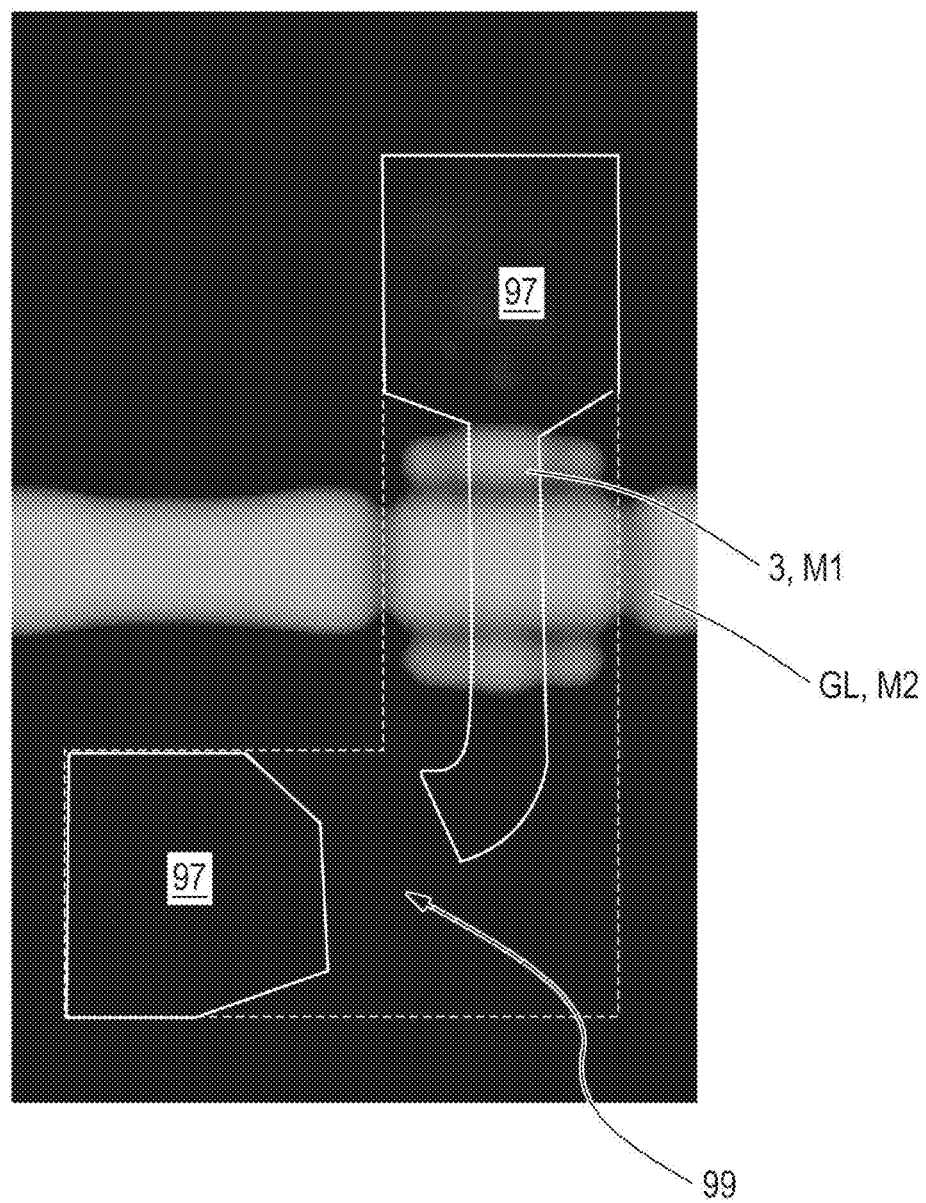
FIG. 13 is a top view of an oxide semiconductor TFT according to the reference example.

FIG. 13 is a plan view of an oxide semiconductor TFT according to the reference example, and illustrates a case where the defect 99 occurs in the oxide semiconductor layer 97.

On the other hand, in the present embodiment, since the lower insulating layer 5 is not patterned before the oxide semiconductor film is formed, it is not desired to form a resist layer on the lower insulating layer 5, and no resist residue is generated on the upper surface of the lower insulating layer 5. Therefore, the defect of the oxide semiconductor film is not generated due to the resist residue, so that the reliability can be improved as compared with the reference example.

According to the manufacturing method of the reference example, the surface m1 of the low resistance metal film such as the Cu film in the source bus line SL and the oxide semiconductor layer 97 cannot form good ohmic contact, so that the contact resistance may increase. Furthermore, when the lower insulating layer 95 is heat-treated for the purpose of ensuring the reliability of the lower insulating layer 95, the surface m1 of the source bus line SL exposed in the source opening portion 95s may be damaged or oxidized, which can result in further increase in contact resistance.

On the other hand, in the present embodiment, the source contact holes CHs of the source contact portion SC can be formed by etching the lower insulating layer 5 and the interlayer insulating layer 10 after forming the interlayer insulating layer 10. Therefore, it is possible to suppress an increase in contact resistance due to process damage of the source bus line SL. In the present embodiment, the oxide semiconductor layer 7 and the source bus line SL are connected to each other by using the connection electrode 8 in the third metal layer M3 in the source contact portion SC. Even when the upper surface of the source bus line SL is a low resistance metal surface such as Cu or Al, by using a conductive film (ohmic conductive film) capable of forming an ohmic contact with an oxide semiconductor such as a Ti film in the lowermost layer of the connection electrode 8, the contact resistance of the source contact portion SC can be further reduced.

Therefore, it is possible to reduce the contact resistance without forming an ohmic conductive film on the Cu film of the source bus line SL.

Furthermore, in the reference example, the patterning step of the lower insulating layer 95 for forming the source opening portion 95s and the patterning step of the interlayer insulating layer (not illustrated) for forming the drain contact portion are performed separately. Therefore, the number of manufacturing steps and the number of photomasks used increases. On the other hand, in the present embodiment, it is possible to simultaneously form the source contact hole CHs in the etching step of forming the drain contact hole CHd. Therefore, the number of manufacturing steps and the number of photomasks can be reduced as compared with the reference example.

Wiring Connection Portion

The active matrix substrate 101 may be provided with a plurality of wiring connection portions provided in the peripheral region. The wiring connection portion is a connection portion for connecting wires in different metal layers, for example, connecting the wiring in the first metal layer M1 and the wiring in the second metal layer M2 or the third metal layer M3. Among the wiring connection portions, the wiring connection portion that connects the wiring in the first metal layer M1 and the wiring in the second metal layer M2 is referred to as a "source or gate connection portion".

Figure 4A:
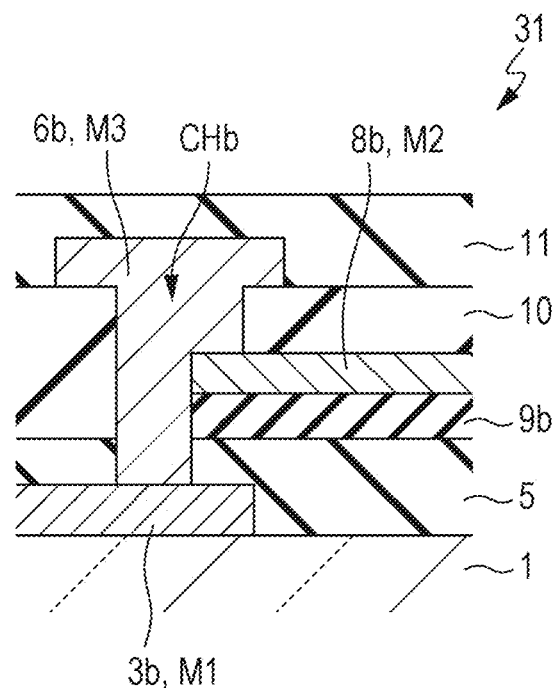
FIG. 4A is a cross-sectional view illustrating a wiring connection portion.

FIG. 4A is a cross-sectional view illustrating an example of a wiring connection portion (source or gate connection portion) in the present embodiment.

In the wiring connection portion 31, the first wiring 3b formed in the first metal layer M1 and the second wiring 8b disposed in the second metal layer M2 are electrically connected via the wiring connection electrode 6b disposed in the third metal layer M3. For example, the second wiring 8b is a gate bus line GL, may be connected to the connection wiring (first wiring 3b) formed in the first metal layer M1 at the wiring connection portion 31, and may be connected to the gate driver via the connection wiring.

The wiring connection portion 31 is provided with first wiring 3b, the lower insulating layer 5 extending on the first wiring 3b, second wiring 8b, an insulating layer 9b disposed between the second wiring 8b and the lower insulating layer 5, an interlayer insulating layer 10 extending on the second wiring 8b, and a wiring connection electrode 6b. The insulating layer 9b is formed of the same insulating film as that of the gate insulating layer 9, and is generally patterned in the same shape as that of the second wiring 8b. Wiring contact holes CHb that expose a portion of the second wiring 8b and a portion of the first wiring 3b are formed in the lower insulating layer 5 and the interlayer insulating layer 10. The wiring connection electrode 6b is disposed on the interlayer insulating layer 10 and in the wiring contact hole CHb, and is connected to both the second wiring 8b and the first wiring 3b in the wiring contact hole CHb.

The wiring contact hole CHb of the wiring connection portion 31 can be formed by the same etching step as those of the source contact hole CHs and the drain contact hole CHd. Therefore, it is possible to form the wiring connection portion 31 on the active matrix substrate 101 without increasing the manufacturing step and the number of photomasks used.

Figure 4B:
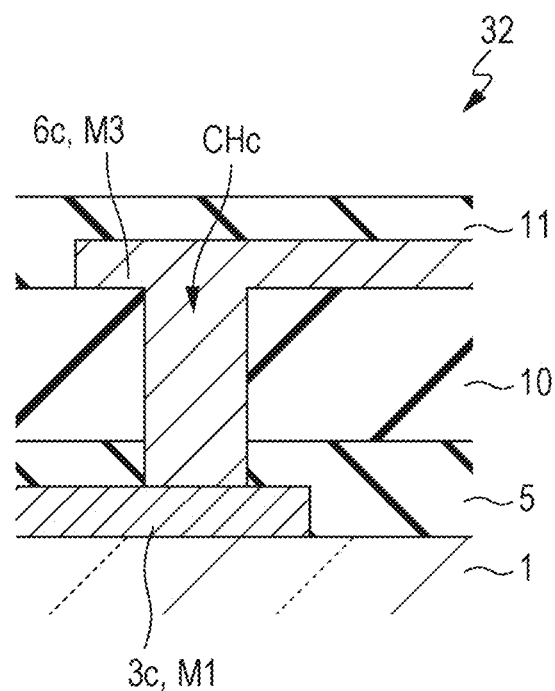
FIG. 4B is a cross-sectional view illustrating another example of a wiring connection portion.

FIG. 4B is a cross-sectional view illustrating another example of the wiring connection portion in the present embodiment.

The wiring connection portion 32 connects the first wiring 3c formed in the first metal layer M1 and the third wiring 6c formed in the third metal layer M3. The wiring connection portion 32 includes the first wiring 3c, the lower insulating layer 5 extending on the first wiring 3c, the interlayer insulating layer 10 and a third wiring 6c. The third wiring 6c is in contact with the first wiring 3c in the wiring contact hole CHc formed in the interlayer insulating layer 10 and the lower insulating layer 5. The wiring contact hole CHc of the wiring connection portion 32 can also be formed by the same etching step as those of the source contact hole CHs and the drain contact hole CHd.

Modification Example

Figure 5A:
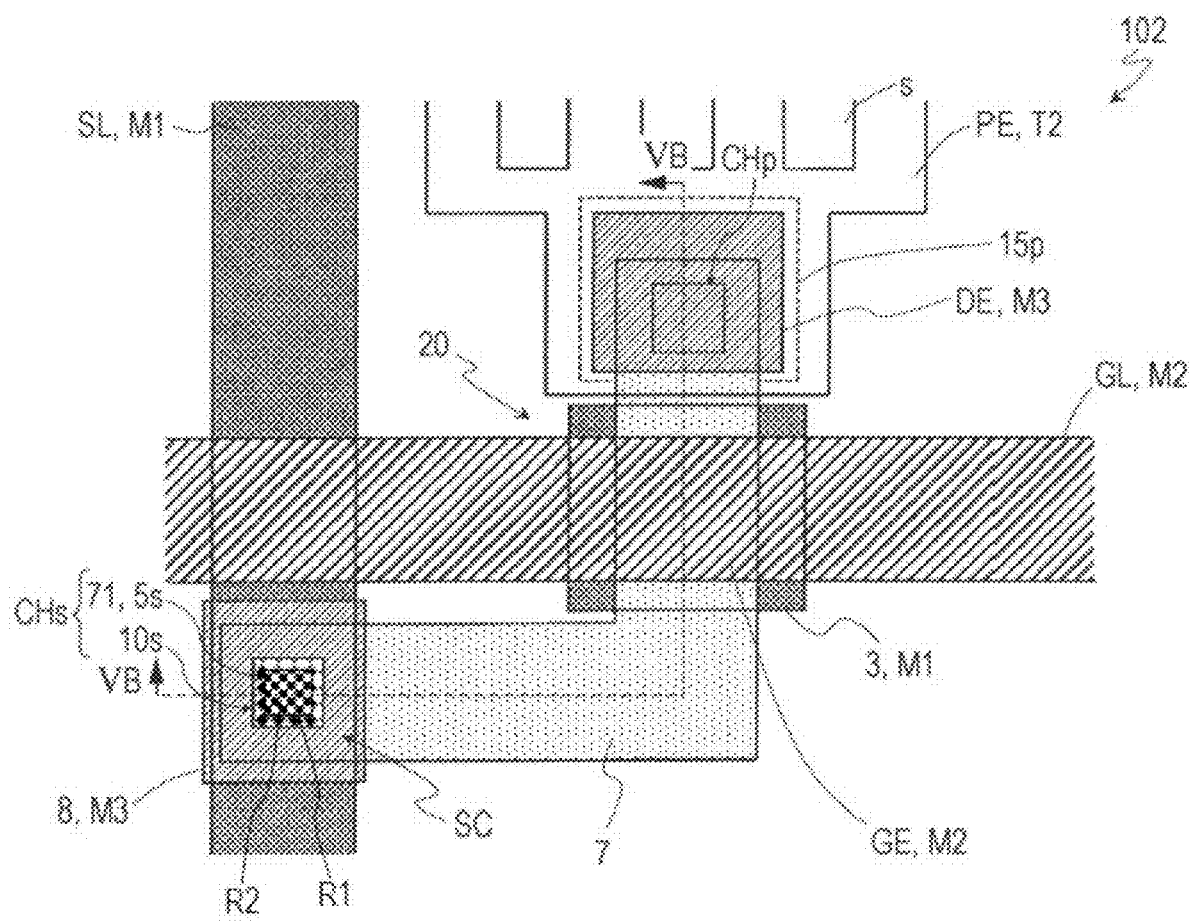
FIG. 5A is a plan view illustrating a pixel region of an active matrix substrate 102 according to a modification example.
Figure 5B:
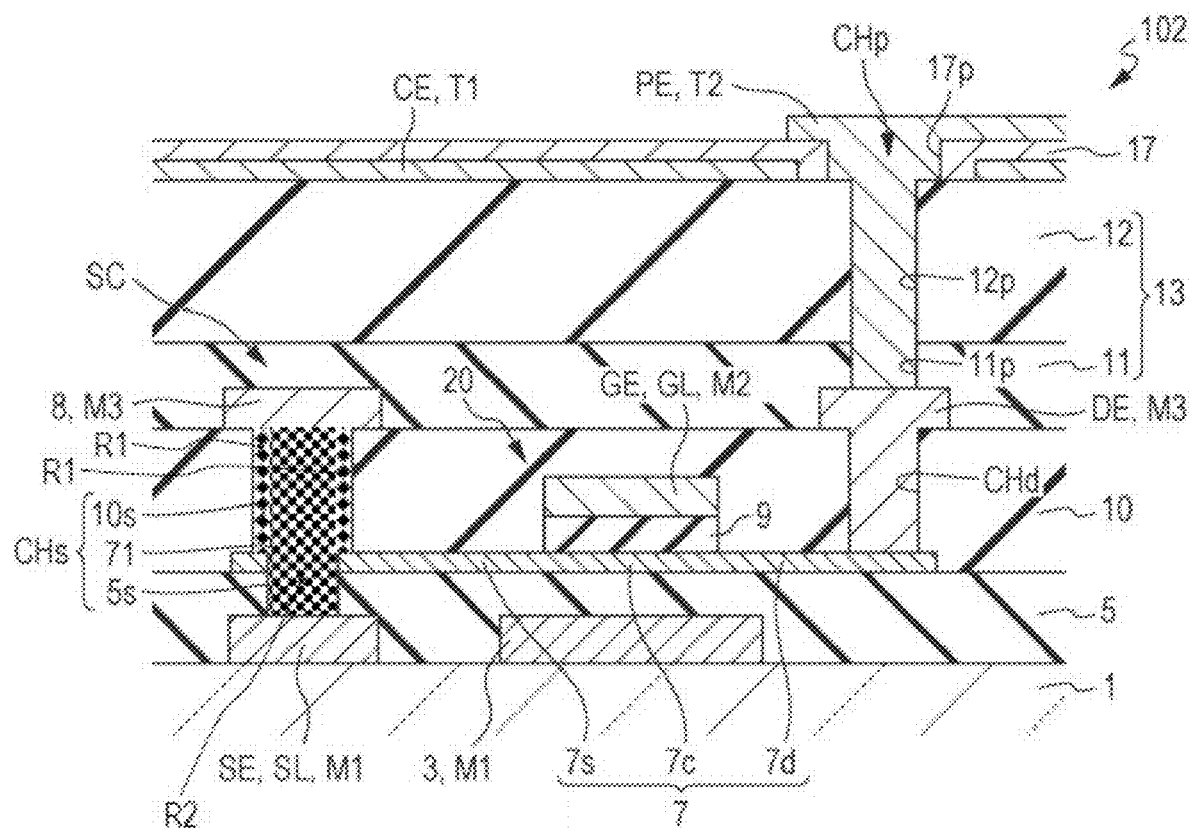
FIG. 5B is a cross-sectional view of the active matrix substrate 102 taken along the line VB-VB illustrated in FIG. 5A.

FIG. 5A is a plan view illustrating a pixel region of an active matrix substrate 102 according to the modification example, and FIG. 5B is a cross-sectional view taken along the line VB-VB across the TFT 20 of the pixel region. The same reference numerals are given to the same components as those in FIGS. 2A and 2B, and the description thereof will be omitted.

The active matrix substrate 102 of the modification example is different from the active matrix substrate 101 in that a first opening portion 71 is formed in the first region 7s of the oxide semiconductor layer 7 in the source contact portion SC.

In the active matrix substrate 102, the source contact hole CHs includes the lower opening portion 5s of the lower insulating layer 5, the first opening portion 71 of the oxide semiconductor layer 7, and the upper opening portion 10s of the interlayer insulating layer 10. The upper opening portion 10s is disposed so as to at least partially overlap the first opening portion 71 of the oxide semiconductor layer 7 when viewed in the direction normal to the substrate 1. When viewed in the direction normal to the substrate 1, the first opening portion 71 and the lower opening portion 5s may be located inside the upper opening portion 10s. As a result, the contact area between the connection electrode 8 and the oxide semiconductor layer 7 can be maintained even in a case where the misalignment occurs. In a case where the first opening portion 71 is located inside the upper opening portion 10s, the entire side surface of the lower opening portion 5s can be aligned with the side surface of the first opening portion 71. Such a structure can be formed by etching the lower insulating layer 5 and the interlayer insulating layer 10 with the oxide semiconductor layer 7 as an etching stop.

Also in the present modification example, the ratio of the area (that is, contact area between the connection electrode 8 and the upper surface of the oxide semiconductor layer 7) S1 of the portion where the upper opening portion 10s and the oxide semiconductor layer 7 overlap to the entire area of the upper opening portion 10s when viewed in the direction normal to the substrate 1 may be, for example, ⅓ or more and ⅔ or less.

Figure 5C:
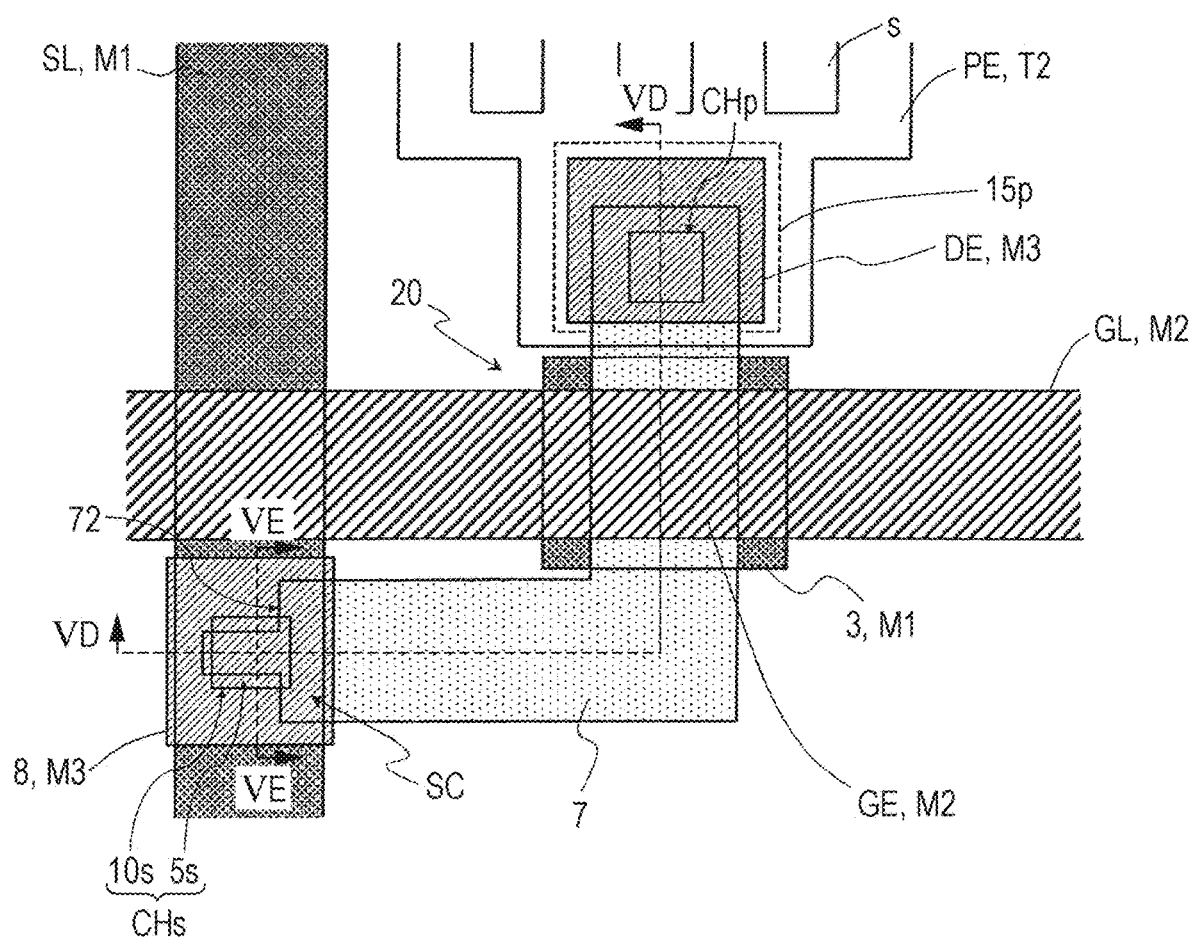
FIG. 5C is a plan view illustrating a pixel region in another active matrix substrate according to a modification example.
Figure 5D:
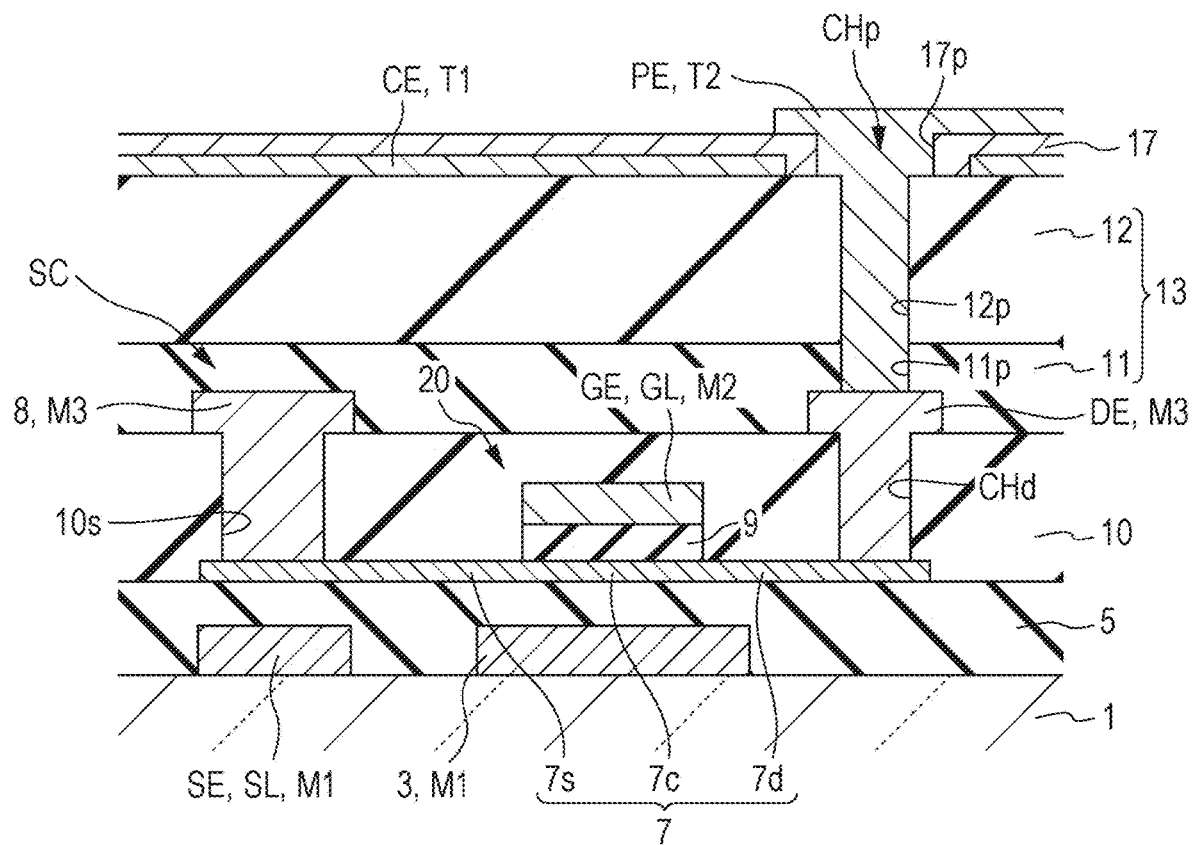
FIG. 5D is a cross-sectional view taken along the line VD-VD illustrated in FIG. 5C.
Figure 5E:
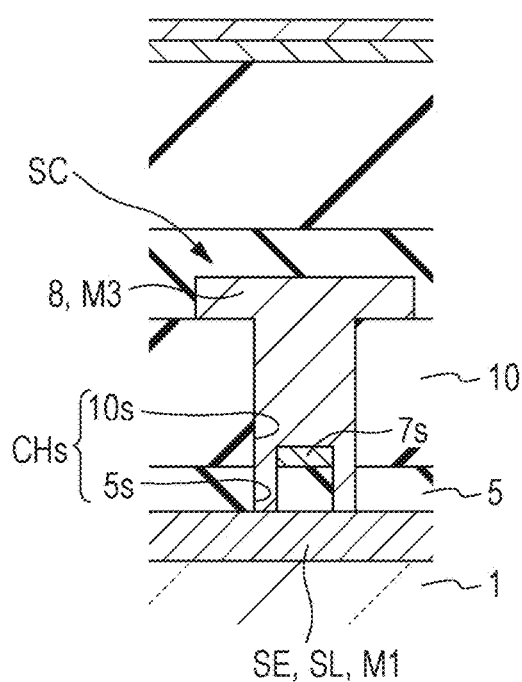
FIG. 5E is a cross-sectional view taken along the line VE-VE illustrated in FIG. 5C.

Instead of providing the first opening portion 71 in the oxide semiconductor layer 7, a notched portion may be provided in the oxide semiconductor layer 7. FIG. 5C is a plan view illustrating a pixel region in another active matrix substrate of the present modification example, FIG. 5D is a cross-sectional view along the line VD-VD across the TFT 20 of the pixel region, and FIG. 5E is cross-sectional view along the line VE-VE across the source contact portion SC. As illustrated in the drawing, the first region 7s of the oxide semiconductor layer 7 includes at least one (here, two) notched portion 72. The upper opening portion 10s is disposed so as to at least partially overlap the notched portion 72 of the oxide semiconductor layer 7 when viewed in the direction normal to the substrate 1. The shape, size, number, and the like of the notched portions 72 are not limited to the illustrated examples. The notched portion 72 may be formed, for example, so that the ratio of the area S1 is ⅓ or more and ⅔ or less.

Second Embodiment

Figure 6A:
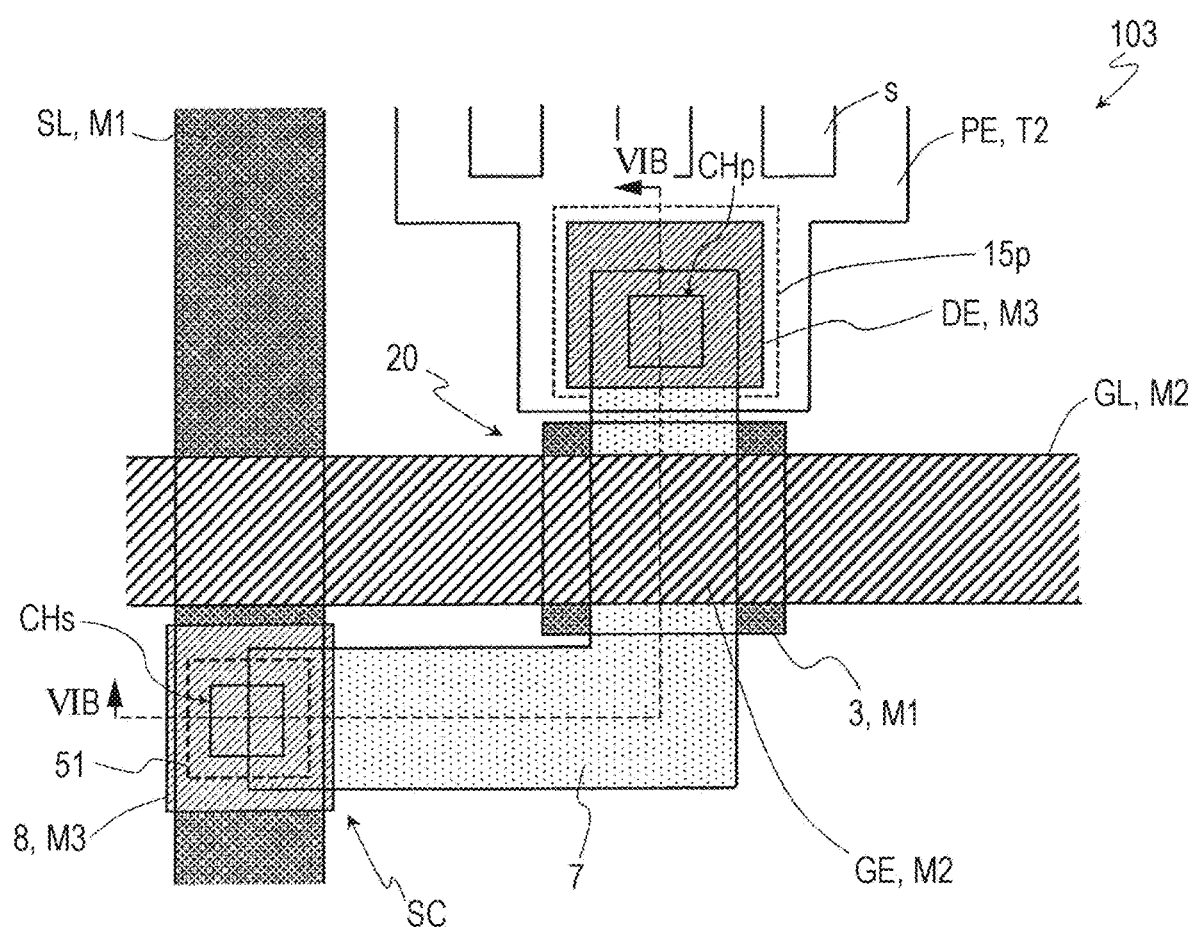
FIG. 6A is a plan view illustrating a pixel region in an active matrix substrate 103 according to a second embodiment.
Figure 6B:
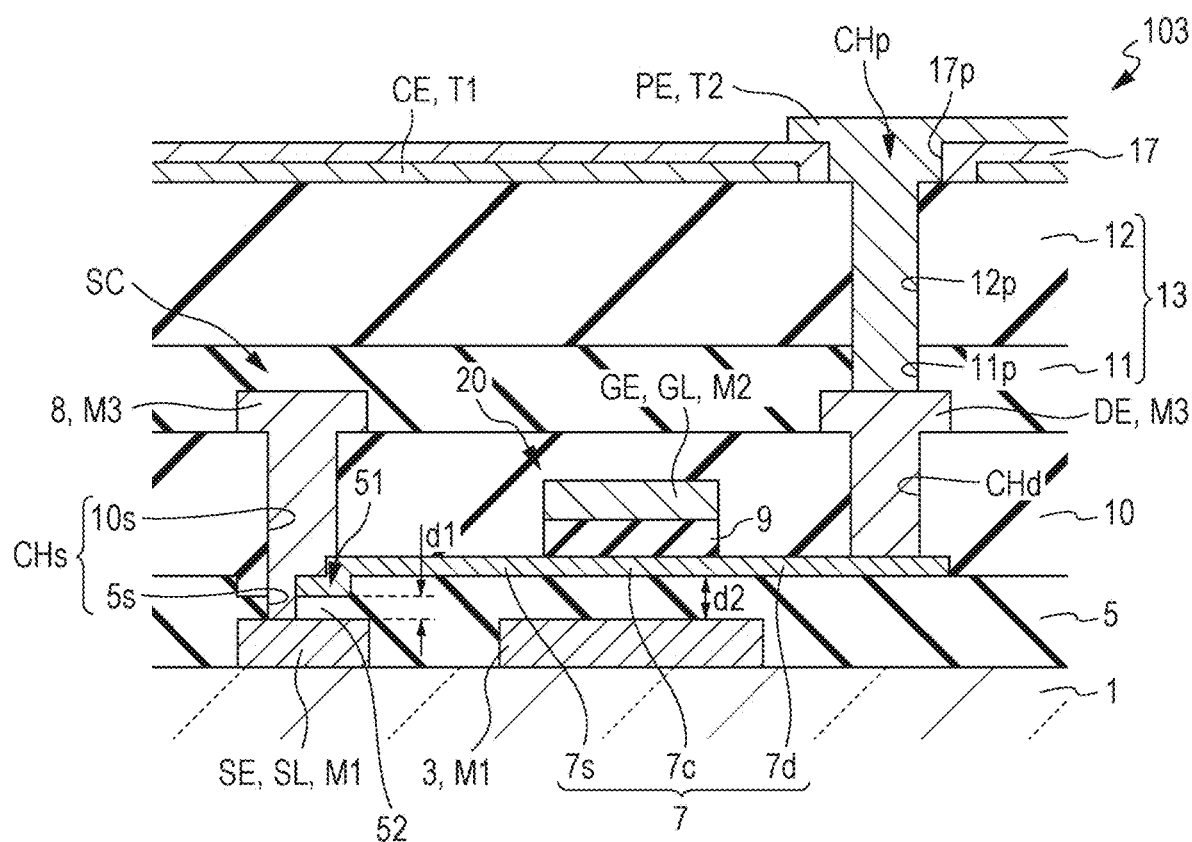
FIG. 6B is a cross-sectional view of the active matrix substrate 103 taken along the line VIB-VIB illustrated in FIG. 6A.

FIG. 6A is a plan view illustrating a pixel region in an active matrix substrate 103 according to a second embodiment, and FIG. 6B is a cross-sectional view taken along the line VIB-VIB across the TFT 20 of the pixel region. The same reference numerals are given to the same components as those in FIGS. 2A and 2B, and the description thereof will be omitted.

The active matrix substrate 103 of the present embodiment is different from the active matrix substrate 101 of the above-described embodiment in that the lower insulating layer 5 includes a thin film region 52 thinner than the other regions in the source contact portion SC. Hereinafter, the differences from the active matrix substrate 101 will be mainly described, and the description of the same configuration will be omitted.

As illustrated in FIG. 6B, in the source contact portion SC, the lower insulating layer 5 is provided with the thin film region 52. The thickness d1 of the thin film region 52 is smaller than the thickness d2 of the other region of the lower insulating layer 5 (for example, region overlapping the channel region 7c when viewed in the direction normal to the substrate 1). The thickness d1 of the thin film region 52 may be, for example, ½ or less of the thickness d2. Here, the thin film region 52 is formed by providing a recessed portion 51 having a predetermined depth on the surface of the lower insulating layer 5.

In the source contact portion SC, the oxide semiconductor layer 7 is disposed so as to partially cover the thin film region 52. The upper opening portion 10s in the source contact hole CHs is disposed so as to at least partially overlap the thin film region 52. The lower opening portion 5s is formed in the thin film region 52 of the lower insulating layer 5. In this example, the lower opening portion 5s is located inside the recessed portion 51 when viewed in the direction normal to the substrate 1.

Method for Manufacturing Active Matrix Substrate 103

FIGS. 7A to 7E are step sectional views for describing an example of a method for manufacturing an active matrix substrate 103 according to the present embodiment, and illustrate each of the TFT forming regions.

Hereinafter, a method for manufacturing one pixel region of the plurality of pixel regions in the active matrix substrate 103 will be described. The material, thickness, forming process, and the like of each layer will be omitted when these are the same as those of the active matrix substrate 101.

Figure 7A:
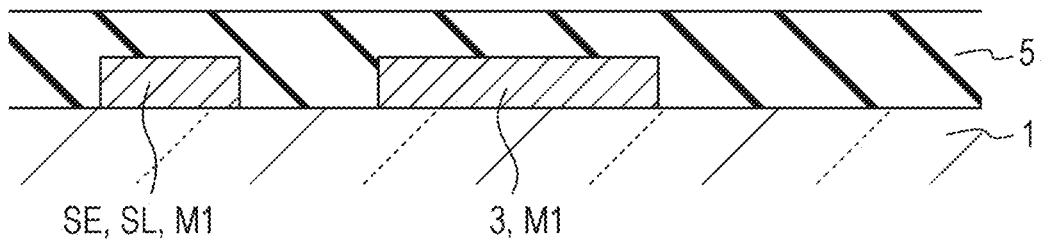
FIG. 7A is a step sectional view illustrating a method for manufacturing the active matrix substrate 103.

First, as illustrated in FIG. 7A, the first metal layer M1 including the light shielding layer 3 of the source bus line SL and the TFT is formed, and then the lower insulating layer 5 is formed so as to cover the first metal layer M1.

Figure 7B:
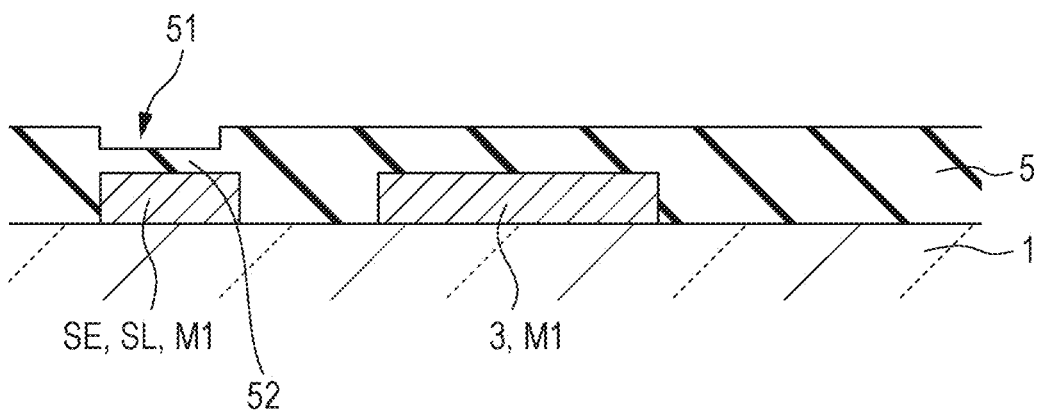
FIG. 7B is a step sectional view illustrating a method for manufacturing the active matrix substrate 103.

Thereafter, as illustrated in FIG. 7B, in each region (source contact portion forming region) where the source contact portion is to be formed, the thin film region 52 is formed in the lower insulating layer 5 by forming the recessed portion 51 on the surface of the lower insulating layer 5. For example, the recessed portion 51 can be formed by forming a resist layer on the lower insulating layer 5 in a known photolithography step and etching only the upper portion of the lower insulating layer 5 using the resist layer as a mask (half-etching).

Figure 7C:
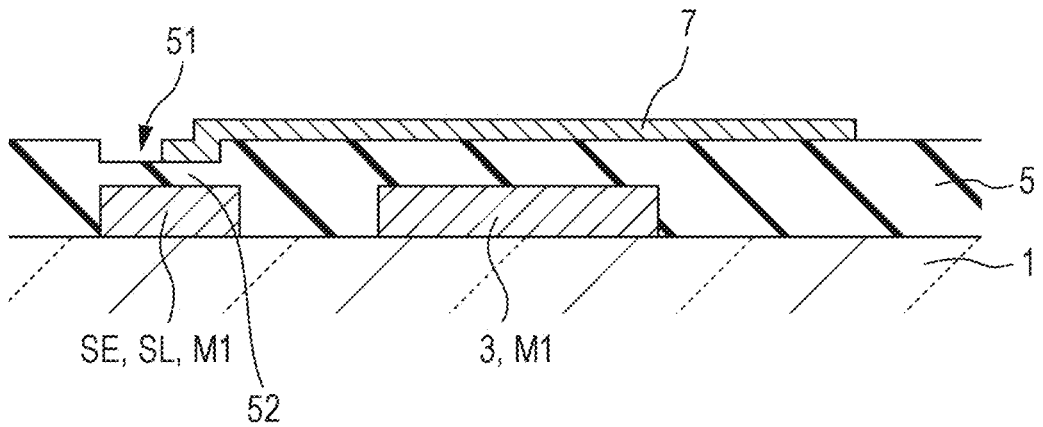
FIG. 7C is a step sectional view illustrating a method for manufacturing the active matrix substrate 103.

Subsequently, as illustrated in FIG. 7C, the oxide semiconductor layer 7 is formed on the lower insulating layer 5. Here, the oxide semiconductor layer 7 is disposed so as to cover only a portion of the recessed portion 51 (that is, only a portion of the thin film region 52).

Figure 7D:
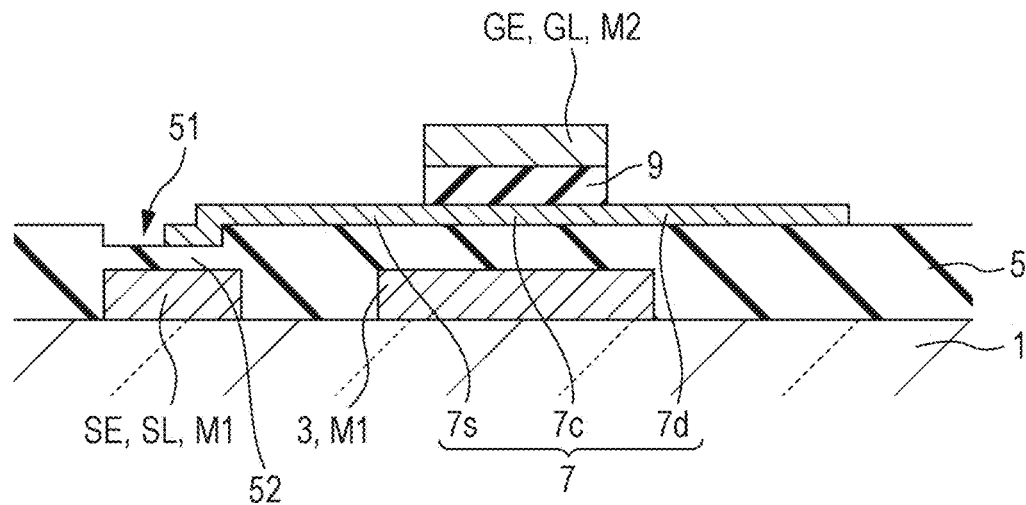
FIG. 7D is a step sectional view illustrating a method for manufacturing the active matrix substrate 103.

Next, as illustrated in FIG. 7D, the gate insulating layer 9 and the gate electrode GE are formed on a portion of the oxide semiconductor layer 7. Thereafter, the oxide semiconductor layer 7 is subjected to a resistance lowering treatment to form a channel region 7c, a first region 7s, and a second region 7d in the oxide semiconductor layer 7.

Figure 7E:
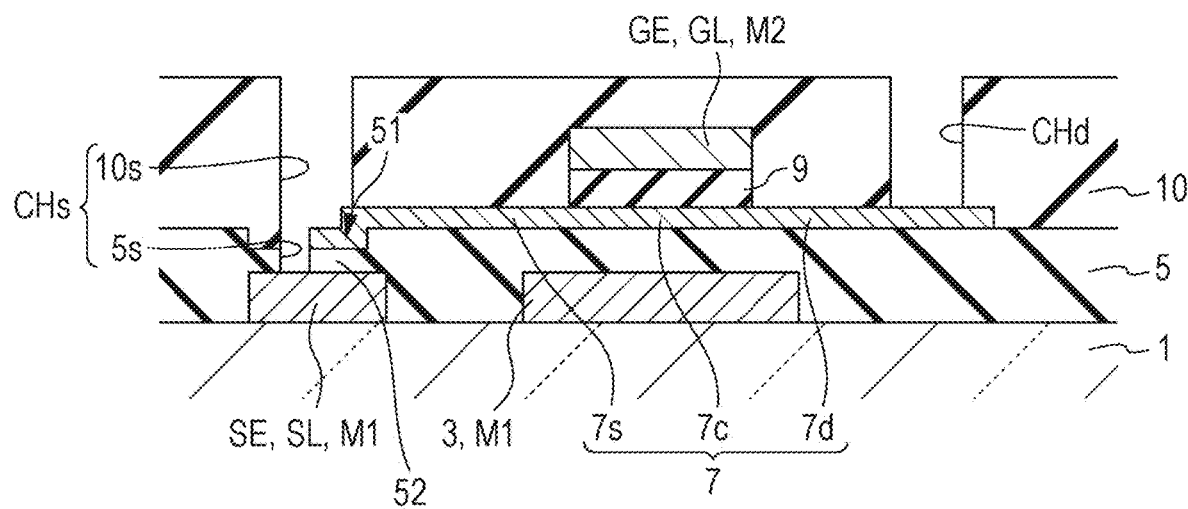
FIG. 7E is a step sectional view illustrating a method for manufacturing the active matrix substrate 103.

Next, as illustrated in FIG. 7E, an interlayer insulating layer 10 covering the oxide semiconductor layer 7, the gate insulating layer 9, and the gate electrode GE is formed, and the interlayer insulating layer 10 is patterned. As a result, a drain contact hole CHd that exposes a portion of the second region 7d of the oxide semiconductor layer 7 is formed in the interlayer insulating layer 10, and the source contact holes CHs that expose a portion of the source bus line SL (or source electrode SE) and a portion of the first region 7s of the oxide semiconductor layer 7 are formed in the interlayer insulating layer 10 and the lower insulating layer 5. The source contact hole CHs includes the lower opening portion 5s formed in the thin film region 52 of the lower insulating layer 5 and the upper opening portion 10s formed in the interlayer insulating layer 10. The upper opening portion 10s is disposed so that a portion thereof overlaps the oxide semiconductor layer 7 and a remaining portion overlaps the thin film region 52 when viewed in the direction normal to the substrate 1. As a result, only the thin film region 52 of the lower insulating layer 5 is etched to form the lower opening portion 5s. A portion of the side surface of the lower opening portion 5s is aligned with the side surface of the oxide semiconductor layer 7, and the other portion is aligned with the side surface of the upper opening portion 10s.

Subsequently, although not illustrated, the connection electrode 8 is formed on the interlayer insulating layer 10 and in the source contact hole CHs, and the drain electrode DE is formed on the interlayer insulating layer 10 and in the drain opening portion 10p. The connection electrode 8 is in direct contact with the source bus line SL and the first region 7s. The subsequent steps are the same as those of the active matrix substrate 101, and thus the description thereof will be omitted.

According to the present embodiment, it is possible to reduce the contact resistance of the source contact portion SC similarly to the above-described embodiment.

According to the present embodiment, as compared with the first embodiment (FIGS. 3A to 3L), the number of thinning (half-etching) steps of the lower insulating layer 5 is increased, and the number of photomasks used is increased by one. However, the present embodiment has the following advantages.

In the above-described embodiment, the interlayer insulating layer 10 and the lower insulating layer 5 are etched using the same resist mask as that in the patterning step of forming the source contact hole CHs and the drain contact hole CHd. After the interlayer insulating layer 10 is etched to expose a portion of the oxide semiconductor layer 7, the exposed portion of the oxide semiconductor layer 7 in the source contact hole CHs and the drain contact hole CHd is exposed to the etching gas until the etching of the lower insulating layer 5 is completed, so that the exposed portion may be damaged. In a case where the wiring connection portion 31 (FIG. 4A) is formed, the exposed portion of the second wiring 8b in the wiring contact hole CHb is similarly damaged. During the etching of the lower insulating layer 5, the edge of the resist layer may recede due to the etching gas, and the size of the contact hole may be larger than a predetermined size. On the other hand, according to the present embodiment, since the lower insulating layer 5 in the region forming the source contact hole CHs is thinned, the etching time of the lower insulating layer 5 is shortened. As a result, damage to the oxide semiconductor layer 7 and the wiring exposed by etching of the interlayer insulating layer 10 can be suppressed, and the shift amount in the size of the contact hole can be reduced.

When a through hole reaching the source bus line SL is formed in the lower insulating layer 5 before the oxide semiconductor layer 7 is formed, the exposed portion of the source bus line SL may be damaged by the etching solution of the oxide semiconductor film. On the other hand, in the present embodiment, only the lower insulating layer 5 is thinned before the oxide semiconductor layer 7 is formed, and the source bus line SL is not exposed. Therefore, damage to the source bus line SL due to the etching solution of the oxide semiconductor film can be avoided.

In the present embodiment, the thinner the thin film region 52, the shorter the time desired for etching the lower insulating layer 5 in the etching step of forming the source contact hole CHs, so that damage to the exposed portion of the oxide semiconductor layer 7 and shift in the size of the contact hole can be suppressed more effectively. From this point of view, the thickness d1 of the thin film region 52 may be, for example, ½ or less, and desirably ⅓ or less of the thickness d2 of the other region of the lower insulating layer 5 (for example, the thickness of the portion overlapping the channel region 7c). The lower limit of the thickness d1 of the thin film region 52 is not particularly limited as long as the source bus line SL is not exposed, and is set to, for example, 100 nm or more (30% or more of the thickness d2) in consideration of etching accuracy and the like.

Although not illustrated, also in the present embodiment, the oxide semiconductor layer 7 may be provided with a first opening portion or a notched portion as in the modification example described with reference to FIGS. 5A and 5B. When viewed in the direction normal to the substrate 1, the first opening portion may be located inside the thin film region 52 (inside the recessed portion 51).

Wiring Connection Portion

Figure 8A:
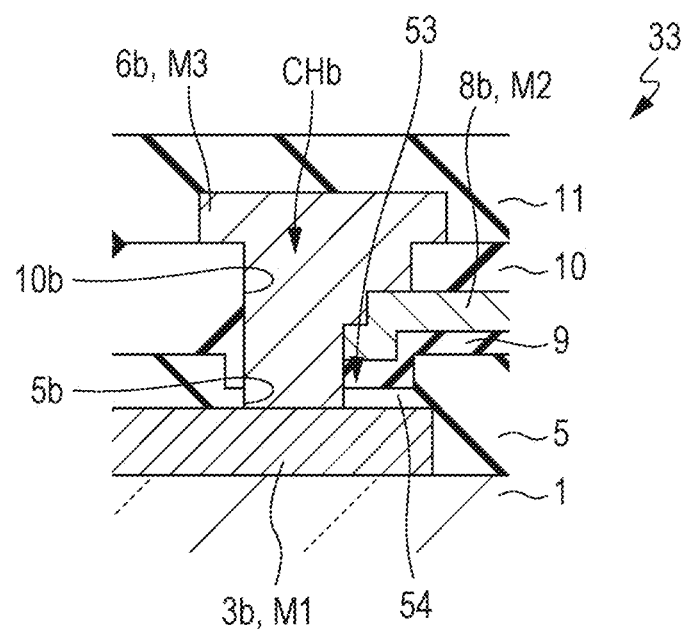
FIG. 8A is a cross-sectional view illustrating a wiring connection portion.
Figure 8B:
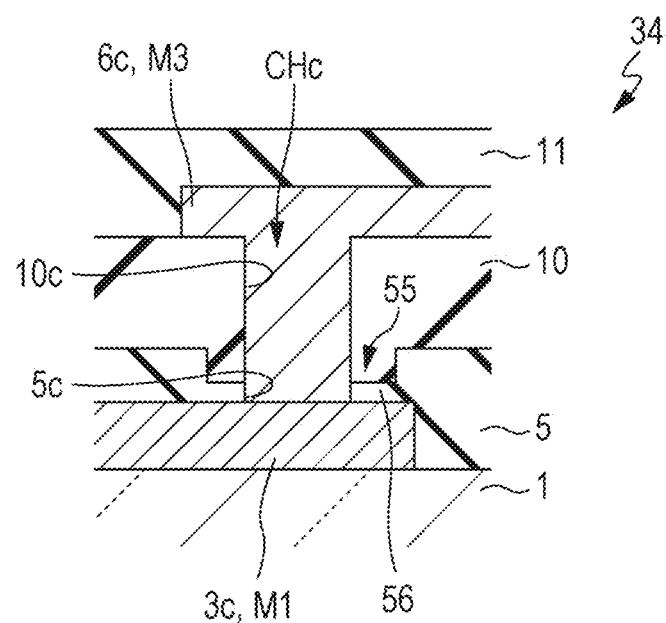
FIG. 8B is a cross-sectional view illustrating another example of a wiring connection portion.

FIG. 8A is a cross-sectional view illustrating an example of a wiring connection portion in the present embodiment. FIG. 8B is a cross-sectional view illustrating another example of a wiring connection portion.

As illustrated in FIG. 8A, in the wiring connection portion (gate or source connection portion) 33, the first wiring 3b formed in the first metal layer M1 and the second wiring 8b disposed in the second metal layer M2 are electrically connected to each other via the wiring connection electrode 6b disposed in the third metal layer M3. The wiring contact hole CHb that exposes a portion of the first wiring 3b and a portion of the second wiring 8b is formed in the lower insulating layer 5 and the interlayer insulating layer 10. The wiring contact hole CHb includes the upper opening portion 10b formed in the interlayer insulating layer and the other lower opening portion 5b formed in the lower insulating layer. The wiring connection electrode 6b is disposed on the interlayer insulating layer 10 and in the wiring contact hole CHb, and is connected to the first wiring 3b and the second wiring 8b in the wiring contact hole CHb.

The surface of the lower insulating layer 5 includes a recessed portion 53 in the wiring connection portion 33. The region 54 having the recessed portion 53 is a thin film region thinner than the other regions of the lower insulating layer 5. When viewed in the direction normal to the substrate 1, the lower opening portion 5b of the wiring contact hole CHb is located inside the recessed portion 53. In other words, the lower opening portion 5b is formed in a thin film region 54 of the lower insulating layer 5. Other configurations are the same as those of the wiring connection portion 31 in the first embodiment.

As illustrated in FIG. 8B, the wiring connection portion 34 connects the first wiring 3c formed in the first metal layer M1 and the third wiring 6c formed in the third metal layer M3. The wiring contact hole CHc that exposes a portion of the first wiring 3c is formed in the lower insulating layer 5 and the interlayer insulating layer 10. The wiring contact hole CHc includes the upper opening portion 10c formed in the interlayer insulating layer and the other lower opening portion 5c formed in the lower insulating layer. The side surfaces of these opening portions are aligned with each other. The third wiring 6c is disposed on the interlayer insulating layer 10 and in the wiring contact hole CHc, and is connected to the first wiring 3c in the wiring contact hole CHc.

In the wiring connection portion 34, the surface of the lower insulating layer 5 includes a recessed portion 55. The region 56 having the recessed portion 55 is a thin film region thinner than the other regions of the lower insulating layer 5. When viewed in the direction normal to the substrate 1, the lower opening portion 5c of the wiring contact hole CHc is located inside the recessed portion 55. In other words, the lower opening portion 5c is formed in the thin film region 56 of the lower insulating layer 5. Other configurations are the same as those of the wiring connection portion 32 in the first embodiment.

The wiring contact holes CHb and CHc in the wiring connection portions 33 and 34 can all be formed by the same etching step as those of the source contact hole CHs and the drain contact hole CHd. Therefore, it is possible to form the wiring connection portion 33 and/or the wiring connection portion 34 on the active matrix substrate 103 without increasing the manufacturing step and the number of photomasks used. In the region where these contact holes are formed, the lower insulating layer 5 is thinned, so that the etching time of the lower insulating layer 5 is shortened. Therefore, damage to the oxide semiconductor layer 7 and the like exposed by etching the interlayer insulating layer 10 can be reduced. The shift amount in the size of the contact hole can be reduced.

Third Embodiment

Figure 9A:
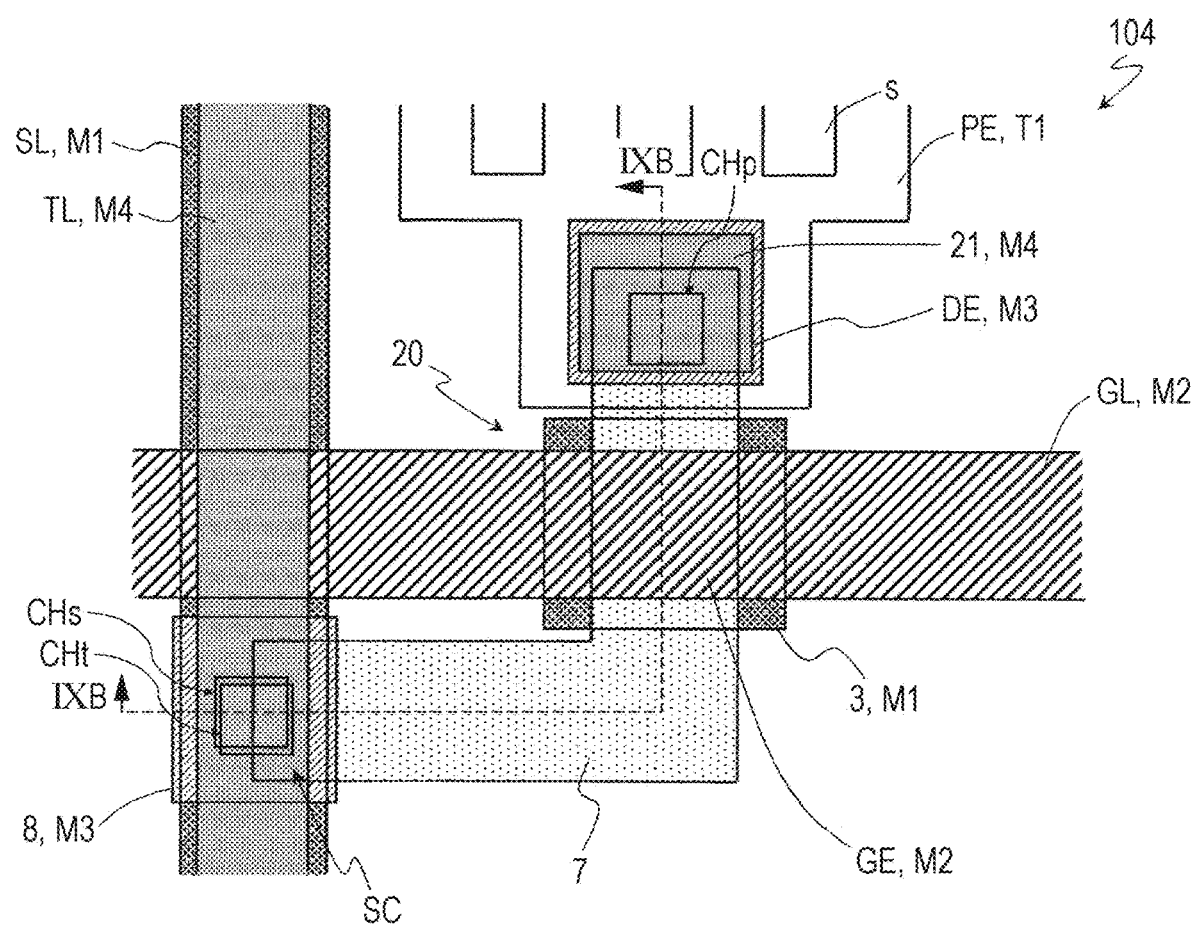
FIG. 9A is a plan view illustrating a pixel region in an active matrix substrate 104 according to a third embodiment.
Figure 9B:
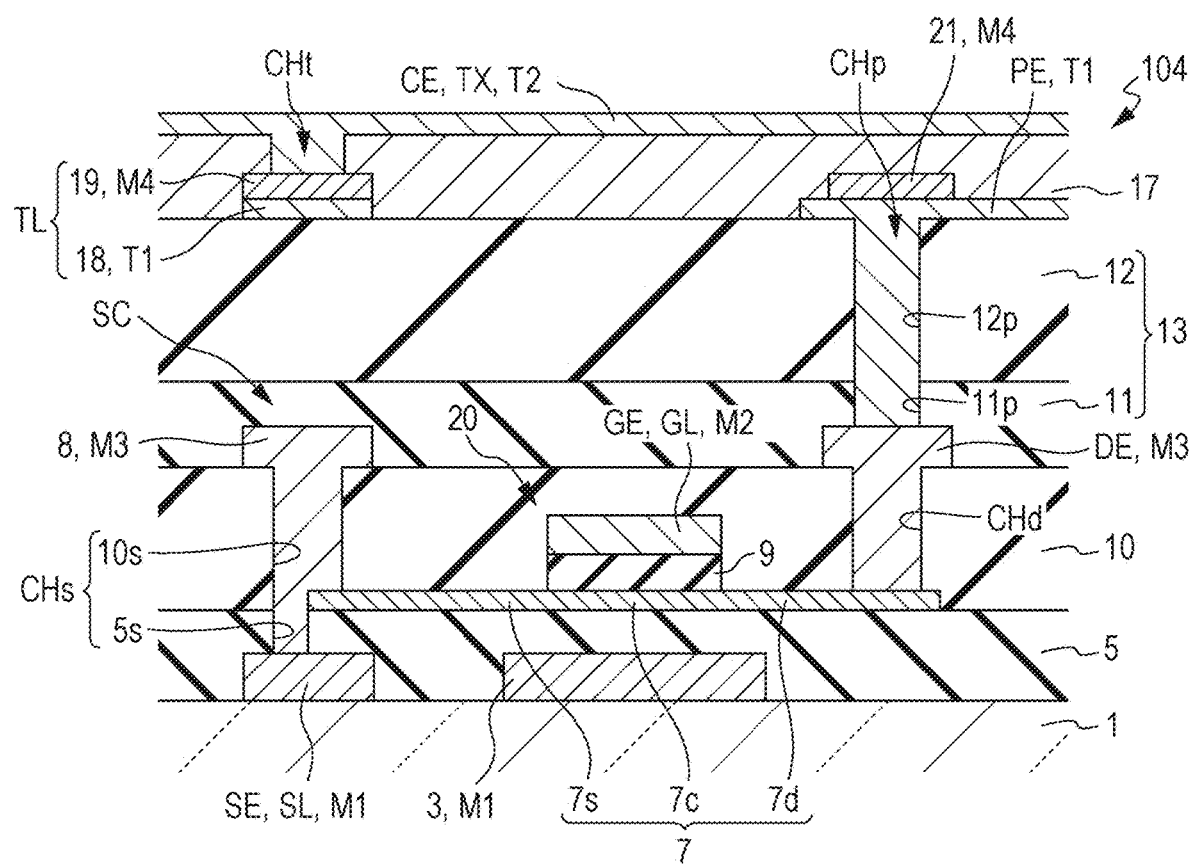
FIG. 9B is a cross-sectional view of the active matrix substrate 104 taken along the line IXB-IXB illustrated in FIG. 9A.

FIG. 9A is a plan view illustrating a pixel region of an active matrix substrate 104 according to a third embodiment, and FIG. 9B is a cross-sectional view taken along the line IXB-IXB across the TFT 20 of the pixel region. The same reference numerals are given to the same components as those in FIGS. 2A and 2B, and the description thereof will be omitted.

The active matrix substrate 104 of the present embodiment is different from the active matrix substrate 101 in that the active matrix substrate 104 is further provided with electrodes for a plurality of electrodes for touch sensors (hereinafter, "touch sensor electrodes") TX and a plurality of wires for driving and/or detecting the touch sensor (hereinafter, "touch wires") TL.

The structure of the TFT 20 and the source contact portion SC in the active matrix substrate 104 is the same as that of the active matrix substrate 101. Although not illustrated, the structure of the source contact portion SC may be the same as those of another active matrix substrates 102 and 103.

The touch wire TL is disposed on the upper insulating layer 13 at intervals from the pixel electrode PE. In this example, the touch wire TL extends in the column direction so as to overlap the source bus line SL when viewed in the direction normal to the substrate 1.

The touch wire TL has a multilayer structure of a lower layer 18 formed in the lower transparent conductive layer T1 and an upper layer 19 formed on the lower layer 18. The upper layer 19 is formed of a fourth conductive film (typically a metal film). A layer including an electrode or wiring formed of the fourth conductive film is referred to as a "fourth metal layer M4". The lower layer 18 and the upper layer 19 are patterned using the same resist mask, and are aligned with each other when viewed in the direction normal to the substrate 1.

The fourth metal layer M4 and the lower transparent conductive layer T1 are covered with the dielectric layer 17.

The common electrode CE is disposed on the dielectric layer 17. In the present embodiment, the common electrode CE is separated into a plurality of segments, and each segment also functions as a touch sensor electrode TX. Each touch sensor electrode TX is disposed corresponding to, for example, a plurality of pixel regions.

Each touch sensor electrode TX is connected to the corresponding touch wire TL. Here, the touch sensor electrode TX is connected to the upper layer 19 of the touch wire TL in the touch contact hole CHt formed in the dielectric layer 17. A connection portion TC between the touch sensor electrode TX and the touch wire TL is referred to as a "touch wire contact portion". At least one touch wire TL may be provided for one touch sensor electrode TX. Two or more touch wires TL may be provided for one touch sensor electrode TX.

The touch wire TL extends to the peripheral region of the active matrix substrate 104 and is connected to a touch drive portion (not illustrated) provided (mounted or integrally) in the peripheral region.

The touch drive portion is configured to switch between a display mode in which the plurality of touch sensor electrodes TX function as the common electrode CE and a touch detection mode in which the plurality of touch sensor electrodes TX function as the touch sensor electrode TX in a time division manner. For example, in the display mode, the touch drive portion applies a common signal to the touch sensor electrode TX (common electrode CE) via the touch wire TL. On the other hand, in the touch detection mode, the touch drive portion applies a touch drive signal to the touch sensor electrode TX via the touch wire TL.

The active matrix substrate 104 may further include a first electrode 21 formed in the pixel contact portion using the same conductive film as that of the upper layer 19 (that is, in the fourth metal layer M4). The first electrode 21 is disposed on a portion of each pixel electrode PE in contact with the pixel electrode PE. The first electrode 21 is an island-shaped electrode disposed so as to overlap the pixel contact hole CHp when viewed in the direction normal to the substrate 1. In this example, the first electrode 21 overlaps the entire pixel contact hole CHp (entire bottom surface of the pixel contact hole CHp) when viewed in the direction normal to the substrate 1. By providing the first electrode 21, it is possible to protect the surface of the drain electrode DE while ensuring the pixel aperture ratio. Details will be described later.

The active matrix substrate 104 is applied to, for example, an in-cell touch panel type display device. The in-cell touch panel type display device may have a built-in self-capacity type touch sensor, or may have a built-in mutual capacity type touch sensor. Specific structures, driving methods, and the like of the mutual capacity type and self-capacity type touch sensors are described in, for example, Japanese Unexamined Patent Application Publication No. 2018-5484, International Application No. 2018/092758, International Application No. 2017/126603, and Japanese Unexamined Patent Application Publication No. 2016-126336, and are known, so that detailed description thereof will be omitted. For reference, all the disclosure contents of Japanese Unexamined Patent Application Publication No. 2018-5484, International Application No. 2018/092758, International Application No. 2017/126603, and Japanese Unexamined Patent Application Publication No. 2016-126336 are incorporated herein by reference.

In the present specification, regardless of whether the touch sensor formed on the active matrix substrate 101 is a self-capacity type or a mutual capacity type, the electrode for the touch sensor disposed on the active matrix substrate 101 side is simply referred to as a "touch sensor electrode TX", and the wiring for the touch sensor electrically connected to the touch sensor electrode TX is referred to as a "touch wire".

Method for Manufacturing Active Matrix Substrate 104

FIGS. 10A to 10F are step sectional views for describing an example of a method for manufacturing an active matrix substrate 104 according to the present embodiment, and illustrate each of the TFT forming regions.

Figure 10A:
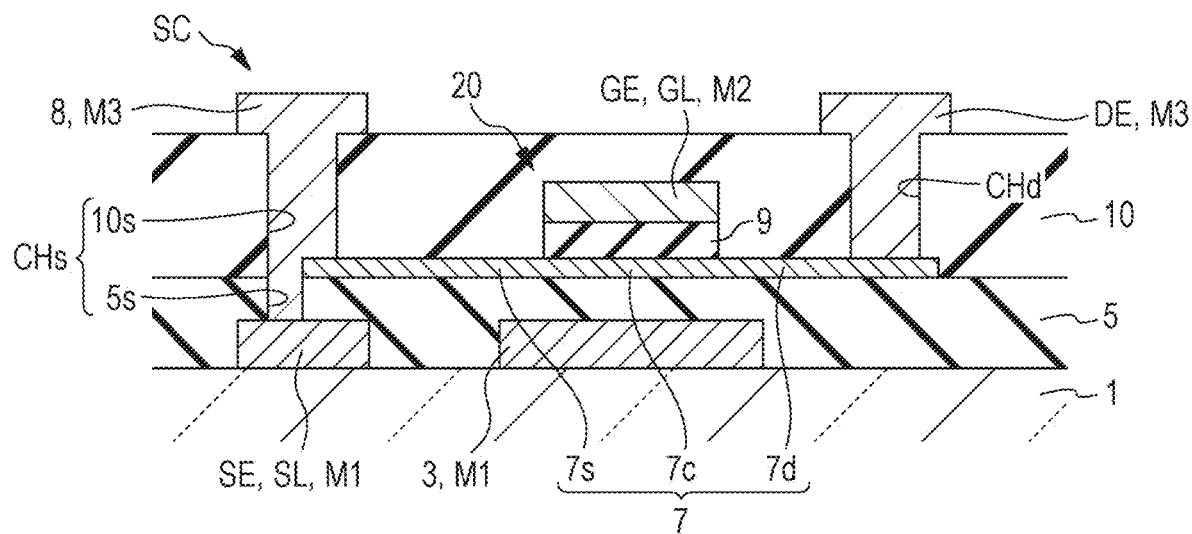
FIG. 10A is a step sectional view illustrating a method for manufacturing the active matrix substrate 104.

First, as illustrated in FIG. 10A, the first metal layer M1, the lower insulating layer 5, the oxide semiconductor layer 7, the gate insulating layer 9, the second metal layer M2, the interlayer insulating layer 10, and the third metal layer M3 are formed on the substrate 1 in the same manner as that of the active matrix substrate 101. As a result, the TFT 20 and the source contact portion SC are obtained.

Figure 10B:
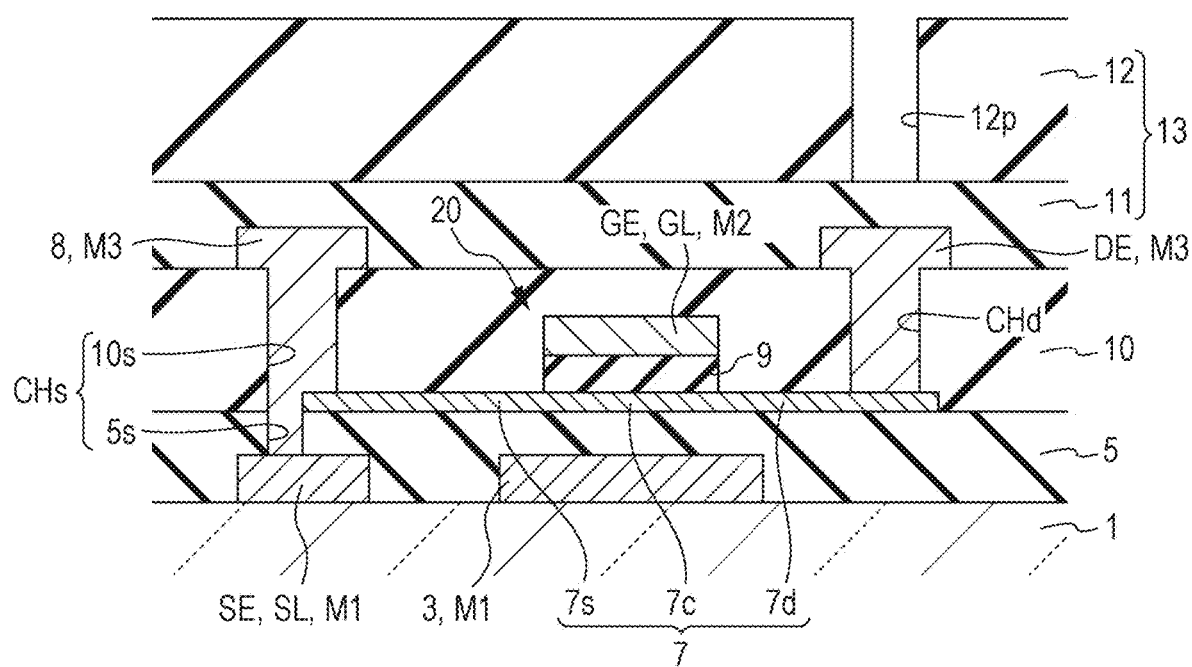
FIG. 10B is a step sectional view illustrating a method for manufacturing the active matrix substrate 104.

Next, as illustrated in FIG. 10B, the upper insulating layer 13 including the inorganic insulating layer 11 and the organic insulating layer 12 is formed so as to cover the third metal layer M3. Thereafter, in each pixel region, an opening portion 12p that exposes a portion of the inorganic insulating layer 11 is formed in the organic insulating layer 12.

Figure 10C:
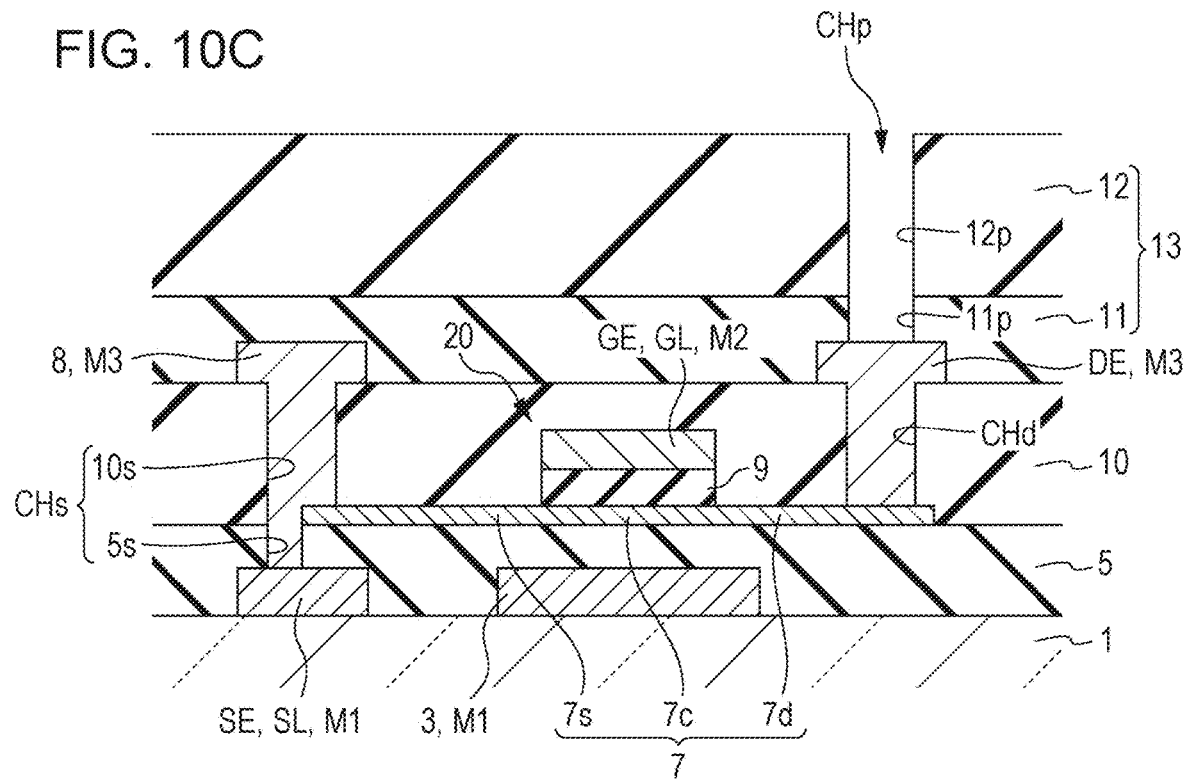
FIG. 10C is a step sectional view illustrating a method for manufacturing the active matrix substrate 104.

Subsequently, as illustrated in FIG. 10C, the inorganic insulating layer 11 is etched using the organic insulating layer 12 as a mask, and an opening portion 11p that exposes the drain electrode DE is provided in the inorganic insulating layer 11. AS described above, the pixel contact hole CHp including the opening portions 11p and 12p is formed.

Figure 10D:
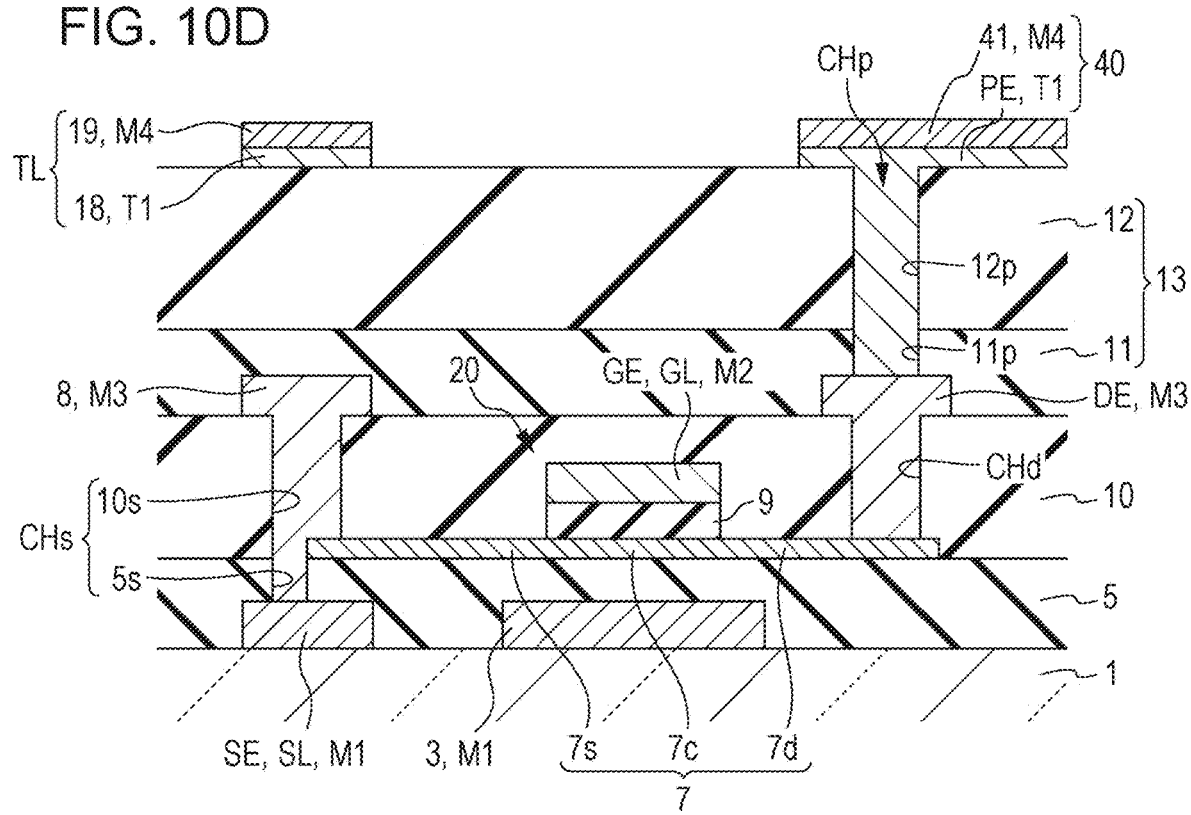
FIG. 10D is a step sectional view illustrating a method for manufacturing the active matrix substrate 104.

Next, a first transparent conductive film (not illustrated) and a fourth conductive film (not illustrated) are formed on the upper insulating layer 13 and in the pixel contact hole CHp. Thereafter, for example, the fourth conductive film is patterned using a hydrogen peroxide-based etching solution, and then etching of the first transparent conductive film is performed using oxalic acid. Alternatively, the first transparent conductive film and the fourth conductive film are patterned using a hydrogen peroxide-based etching solution containing a fluorine compound. As a result, as illustrated in FIG. 10D, the touch wire TL and the multilayer film 40 including the pixel electrode PE are formed so as to be separated from each other. The touch wire TL has a multilayer structure including the lower layer 18 formed of the first transparent conductive film and the upper layer 19 formed of the fourth conductive film. The multilayer film 40 includes the pixel electrode PE and the conductive layer 41 located on the pixel electrode PE and formed of the fourth conductive film. When viewed in the direction normal to the substrate 1, the lower layer 18 and the upper layer 19 are aligned with each other, and the pixel electrode PE and the conductive layer 41 are aligned with each other.

As the fourth conductive film, a conductive film similar to the gate conductive film or the source conductive film can be used. The fourth conductive film may be a metal film (thickness: 50 to 500 nm) mainly made of Cu or Al and having a single layer or a multilayer structure.

Figure 10E:
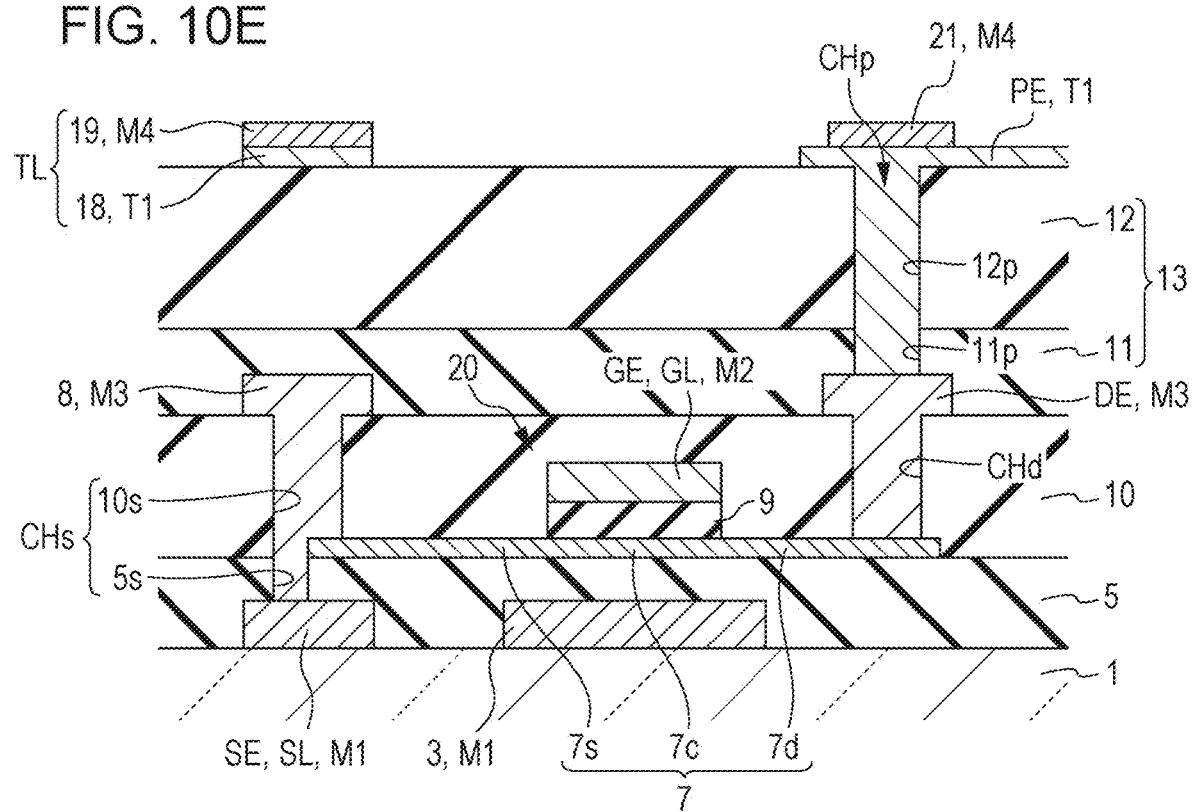
FIG. 10E is a step sectional view illustrating a method for manufacturing the active matrix substrate 104.

Subsequently, as illustrated in FIG. 10E, a first electrode 21 is obtained by patterning the conductive layer 41. The patterning of the conductive layer 41 is performed under the condition that only the conductive layer 41 is etched without etching the pixel electrode PE. Here, for example, wet etching of the conductive layer 41 is performed using a hydrogen peroxide-based etching solution containing no fluorine compound.

Forming the first electrode 21 by the above method has the following merits.

When only the first transparent conductive film (for example, indium-tin oxide (ITO)) is formed on the upper insulating layer 13 and in the pixel contact hole CHp and patterning is performed, since the first transparent conductive film is relatively thin, a pinhole is likely to be formed in the pixel contact hole CHp. When the pinhole is formed in the first transparent conductive film in the pixel contact hole CHp, the surface of the drain electrode DE is exposed by the pinhole and may be damaged. On the other hand, in the present embodiment, the first transparent conductive film and the fourth conductive film are simultaneously patterned in a state where the fourth conductive film is formed on the first transparent conductive film, and the multilayer film 40 including the pixel electrode PE is formed. As a result, the pinhole is unlikely to occur in the first transparent conductive film (pixel electrode PE). Even when the pinhole occurs, since the drain electrode DE is covered with the fourth conductive film, the surface of the drain electrode DE can be protected, and an increase in the contact resistance of the pixel contact portion due to the pinhole can be suppressed. Furthermore, thereafter, a portion located other than the pixel contact portion (that is, portion located in a region contributing to display) of the fourth conductive film (conductive layer 41) covering the entire pixel electrode PE is removed, so that the first electrode 21 is formed. As a result, it is possible to suppress a decrease in the pixel aperture ratio due to the use of the fourth conductive film.

Figure 10F:
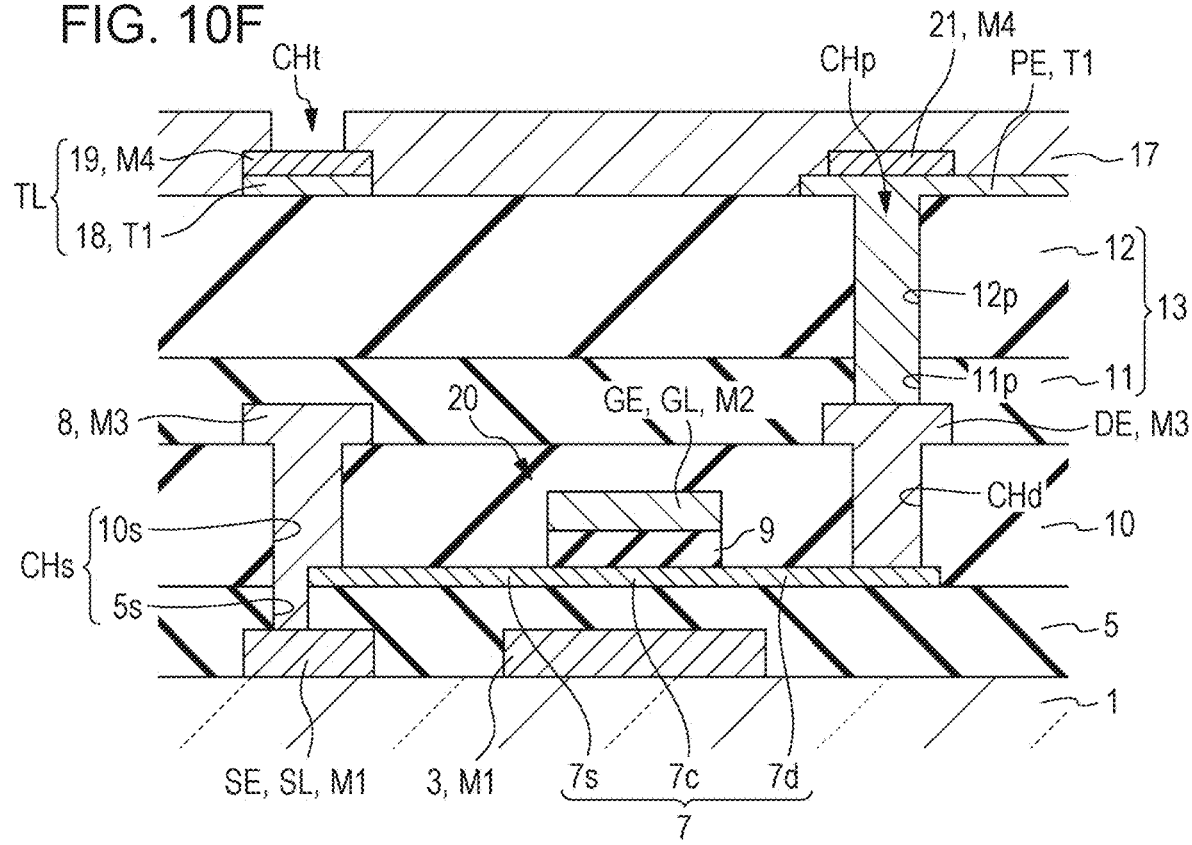
FIG. 10F is a step sectional view illustrating a method for manufacturing the active matrix substrate 104.

Next, as illustrated in FIG. 10F, a dielectric layer (thickness: 50 to 500 nm) 17 is formed so as to cover the touch wire TL, the pixel electrode PE, and the first electrode 21. Thereafter, patterning of the dielectric layer 17 is performed to form a touch contact hole CHt that exposes a portion of the upper layer 19 of the touch wire TL.

Subsequently, a second transparent conductive film is formed on the dielectric layer 17 and in the touch contact hole CHt, and the second transparent conductive film is patterned. As a result, as illustrated in FIGS. 9A and 9B, the common electrode CE including a plurality of segments, each of which functions as a touch sensor electrode TX, is formed. Each touch sensor electrode TX is connected to the corresponding touch wire TL in the touch contact hole CHt. AS described above, the active matrix substrate 104 is manufactured.

The structure of the active matrix substrate for the in-cell touch panel type display device in the present embodiment is not limited to the above-described structure. The source contact portion SC may have the same structure as that of the source contact portion SC in the active matrix substrate 102 or the active matrix substrate 103. The common electrode CE (touch sensor electrode TX) may be formed in the lower transparent conductive layer T1, and the pixel electrode PE may be formed in the upper transparent conductive layer T2. The arrangement of the touch wire TL and the structure of the touch wire contact portion TC are also not particularly limited.

In the present embodiment, the touch wire TL is formed on the fourth metal layer M4 by using the same conductive film as that of the first electrode 21, and other electrodes or wires may be formed instead. Such an active matrix substrate can be applied to display devices other than the in-cell touch panel type. Although not illustrated, the active matrix substrate of another embodiment may also have the fourth metal layer M4 including the first electrode 21 for protection of the drain electrode DE.

Fourth Embodiment

Figure 11A:
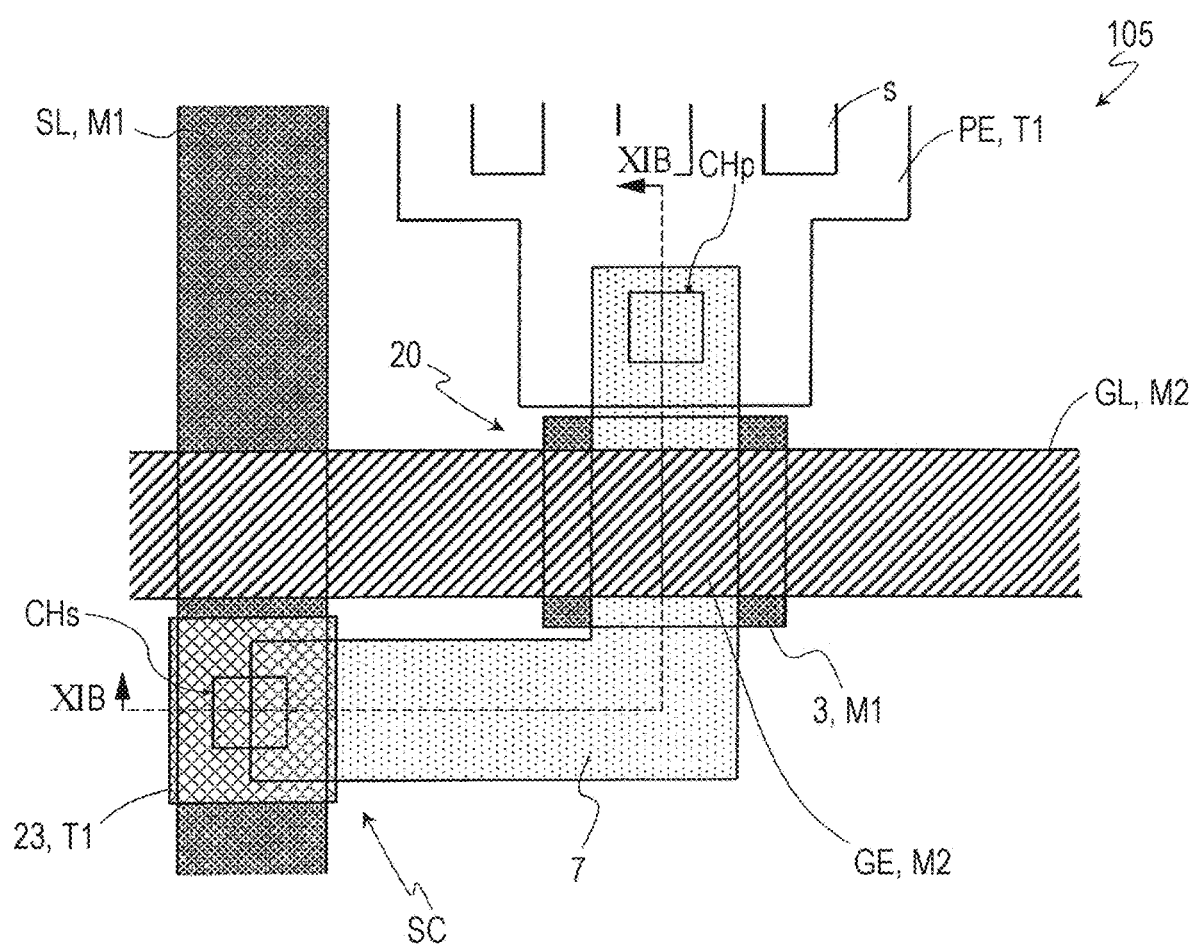
FIG. 11A is a plan view illustrating a pixel region in an active matrix substrate 105 according to a fourth embodiment.
Figure 11B:
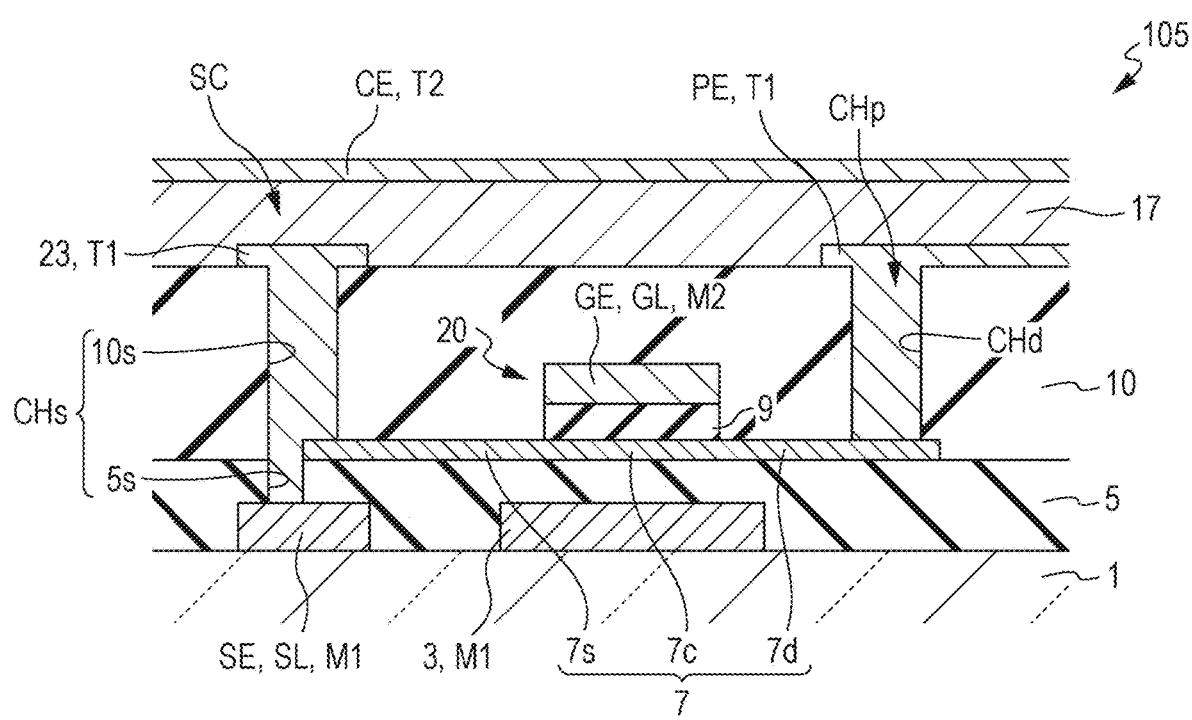
FIG. 11B is a cross-sectional view of the active matrix substrate 105 taken along the line XIB-XIB illustrated in FIG. 11A.

FIG. 11A is a plan view illustrating a pixel region of an active matrix substrate 105 according to the fourth embodiment, and FIG. 11B is a cross-sectional view taken along the line XIB-XIB across the TFT 20 of the pixel region. The same reference numerals are given to the same components as those in FIGS. 2A and 2B, and the description thereof will be omitted.

The active matrix substrate 105 of the present embodiment is different from the active matrix substrate 101 in that the active matrix substrate 105 does not include the third metal layer M3 and the organic insulating layer 12. In the active matrix substrate 105, the connection electrode of the source contact portion SC is formed in the lower transparent conductive layer T1.

In the active matrix substrate 105, the lower transparent conductive layer T1 including the pixel electrode PE and the connection electrode 23 is formed on the interlayer insulating layer 10. The pixel electrode PE is disposed on the interlayer insulating layer 10 and in the drain contact hole CHd formed in the interlayer insulating layer 10, and is disposed in the drain contact hole CHd so as to be in contact with the second region 7d of the oxide semiconductor layer 7. That is, the oxide semiconductor layer 7 of the TFT 20 is electrically connected to the pixel electrode PE without passing through the drain electrode DE. The connection electrode 23 is disposed on the interlayer insulating layer 10 and in the source contact hole CHs formed in the lower insulating layer 5 and the interlayer insulating layer 10, and is connected to the second region 7d of the oxide semiconductor layer 7 and the source bus line SL in the source contact hole CHs.

The pixel electrode PE and the connection electrode 23 are covered with the dielectric layer 17. The upper transparent conductive layer T2 including the common electrode CE is disposed on the dielectric layer 17.

Although not illustrated, the pixel electrode PE and the connection electrode 23 may be formed in the upper transparent conductive layer T2, and the common electrode CE may be formed in the lower transparent conductive layer T1. The structure of the source contact portion SC is not limited to the structure illustrated in the drawing. The present embodiment may have the same structure as those of the source contact portions SC in the active matrix substrate 102 and the active matrix substrate 103 except that the connection electrode is formed by using the transparent conductive film.

According to the present embodiment, by reducing the third metal layer M3, the number of photomasks used is reduced, so that the manufacturing cost can be reduced.

The structure and the method for manufacturing the active matrix substrate of the present embodiment according to the present disclosure are not limited to the structure and the method exemplified above. In the above description, the active matrix substrate provided with a top gate type pixel TFT is exemplified. Instead, a double gate type pixel TFT having two gates with an oxide semiconductor layer interposed therebetween may be used. For example, in the TFT 20 in the above embodiment, the light shielding layer 3 may function as the lower gate electrode.

Embodiments of the present disclosure can be widely applied to devices and electronic devices provided with the TFT. For example, the embodiments can be applied to a circuit substrate such as an active matrix substrate, a liquid crystal display device, an organic EL display device, a display device such as a micro LED display device, an image-capturing apparatus such as a radiation detector and an image sensor, and an electronic device such as an image input device and a fingerprint reading device.

About Oxide Semiconductor

The oxide semiconductor included in the oxide semiconductor layer 7 may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c-axis is substantially perpendicular to a layer surface.

The oxide semiconductor layer 7 may have a multilayer structure of two or more layers. In the case where the oxide semiconductor layer 7 has a multilayer structure, the oxide semiconductor layer 7 may include an amorphous oxide semiconductor layer and a crystalline oxide semiconductor layer. Alternatively, a plurality of crystalline oxide semiconductor layers having different crystal structures may be included. A plurality of amorphous oxide semiconductor layers may be included. In a case where the oxide semiconductor layer 7 has a two-layer structure including an upper layer and a lower layer, the energy gap of the oxide semiconductor included in a layer located on the gate electrode side (lower layer for bottom gate type, and upper layer for top gate type) of the two layers may be smaller than the energy gap of the oxide semiconductor included in a layer located on a side opposite to the gate electrode (upper layer for bottom gate type, and lower layer for top gate type). Hear, in a case where the difference in energy gap between these layers is relatively small, the energy gap of the oxide semiconductor in the layer located on the gate electrode side may be larger than the energy gap of the oxide semiconductor in the layer located on the side opposite to the gate electrode.

Materials, structures, film formation methods, configurations of oxide semiconductor layers having a multilayer structure, and the like of the amorphous oxide semiconductor and each of the above crystalline oxide semiconductors are described in, for example, Japanese Unexamined Patent Application Publication No. 2014-007399. For reference, the entire contents disclosed in Japanese Unexamined Patent Application Publication No. 2014-007399 are incorporated herein.

The oxide semiconductor layer 7 may include, for example, at least one metal element among In, Ga, and Zn. In the present embodiment, the oxide semiconductor layer 7 includes, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), a ratio (composition ratio) of In, Ga, and Zn is not particularly limited, and includes, for example, In:Ga:Zn=2:2:1, In:Ga:Zn=1:1:1, In:Ga:Zn=1:1:2, and the like. Such an oxide semiconductor layer 7 can be formed of an oxide semiconductor film including an In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c-axis is oriented substantially perpendicular to the layer surface is desirable.

The crystal structure of a crystalline In—Ga—Zn—O-based semiconductor is disclosed in, for example, above Japanese Unexamined Patent Application Publication No. 2014-007399, Japanese Unexamined Patent Application Publication No. 2012-134475, and Japanese Unexamined Patent Application Publication No. 2014-209727. For reference, the entire contents disclosed in Japanese Unexamined Patent Application Publication No. 2012-134475 and Japanese Unexamined Patent Application Publication No. 2014-209727 are incorporated herein. A TFT having an In—Ga—Zn—O-based oxide semiconductor layer has high mobility (more than 20 times that of an a-Si TFT) and low leak current (less than $\frac{1}{100}$ that of an a-Si TFT). Therefore, the TFT is suitably used as a driving TFT (for example, TFT included in a driving circuit provided on the same substrate as that of a display region around a display region including a plurality of pixels) and a pixel TFT (TFT provided in a pixel).

The oxide semiconductor layer 7 may include another oxide semiconductor instead of the In—Ga—Zn—O-based semiconductor. For example, an In—Sn—Zn—O-based semiconductor (for example, In2O3-SnO2-ZnO; InSnZnO) may be included. The In—Sn—Zn—O-based semiconductor is a ternary oxide of indium (In), tin (Sn), and zinc (Zn). Alternatively, the oxide semiconductor layer 7 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a cadmium oxide (CdO), Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, In—W—Zn—O-based semiconductor, and the like.

The present disclosure contains subject matter related to that disclosed in U.S. Provisional Patent Application No. 62/971,249 filed in the U.S. Patent Office on Feb. 7, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate includes pixel regions, the active matrix substrate comprising:
    a substrate;
    a first conductive film supported on a main surface of the substrate;
    a lower insulating layer covers the first conductive film;
    an oxide semiconductor layer located above the lower insulating layer;
    a gate insulating layer on the oxide semiconductor layer;
    a second conductive film on the gate insulating layer;
    an interlayer insulating layer covers the second conductive film;
    a third conductive film located above the interlayer insulating layer;
    a lower opening provided in the lower insulating layer;
    a first opening provided in the interlayer insulating layer;
    oxide semiconductor TFTs provided in association with the pixel regions; wherein
    at least one of the oxide semiconductor TFTs includes:
        the oxide semiconductor layer including a channel region, and a first region and a second region located on respective sides of the channel region;
        a gate electrode made of the second conductive film, and overlapping the channel region of the oxide semiconductor layer; and a source electrode made of the first conductive film, and electrically connected to the first region via a connection portion;

the connection portion includes a first connection region where a connection electrode made of the third conductive film and the first region are electrically connected, and a second connection region where the connection electrode and the source electrode are electrically connected; and the second connection region is arranged within the lower opening and the first opening.

2. The active matrix substrate of claim 1, wherein the first connection region is arranged within the first opening.

3. The active matrix substrate according to claim 1, wherein the gate insulating layer covers the channel region of the oxide semiconductor layer, and does not cover any portion of the first region of the oxide semiconductor layer and any portion of the second region of the oxide semiconductor layer.

4. The active matrix substrate according to claim 1, wherein the interlayer insulating layer contacts at least a portion of the first region of the oxide semiconductor layer and at least a portion of the second region of the oxide semiconductor layer.

5. The active matrix substrate according to claim 1, wherein the oxide semiconductor layer includes at least one metal element selected from In, Ga, and Zn.

6. A display device comprising the active matrix substrate according to claim 1.

7. An organic EL display device comprising the active matrix substrate according to claim 1.

8. The active matrix substrate according to claim 1, further comprising:

a second opening provided in the interlayer insulating layer; wherein the at least one of the oxide semiconductor TFTs further includes a drain electrode; and the second region and the drain electrode are electrically connected via the second opening.

9. The active matrix substrate according to claim 8, wherein the drain electrode is formed of the third conductive film.

10. The active matrix substrate according to claim 1, further comprising:

a first metal film made of the first conductive film; wherein the first metal film overlaps the channel region of the oxide semiconductor layer.

11. The active matrix substrate according to claim 10, wherein a first thickness of a region of the lower insulating layer that overlaps the source electrode is less than a second thickness of a region of the lower insulating layer that overlaps the first metal film.

12. The active matrix substrate according to claim 11, wherein the first thickness is ½ or less of the second thickness.

* * * * *